(12) United States Patent
Shirouchi et al.

(10) Patent No.: US 10,466,396 B2
(45) Date of Patent: Nov. 5, 2019

(54) LIQUID CRYSTAL DISPLAY DEVICE

(71) Applicant: SUMITOMO CHEMICAL COMPANY, LIMITED, Tokyo (JP)

(72) Inventors: Yuko Shirouchi, Osaka (JP); Yuji Akiyama, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 338 days.

(21) Appl. No.: 15/128,650

(22) PCT Filed: Mar. 23, 2015

(86) PCT No.: PCT/JP2015/059817
§ 371 (c)(1),
(2) Date: Sep. 23, 2016

(87) PCT Pub. No.: WO2015/147312
PCT Pub. Date: Oct. 1, 2015

(65) Prior Publication Data
US 2017/0123120 A1 May 4, 2017

(30) Foreign Application Priority Data
Mar. 26, 2014 (JP) .................. 2014-063279

(51) Int. Cl.
*G02B 5/22* (2006.01)
*G03F 7/00* (2006.01)
(Continued)

(52) U.S. Cl.
CPC ............. *G02B 5/223* (2013.01); *G02B 5/201* (2013.01); *G02B 6/005* (2013.01);
(Continued)

(58) Field of Classification Search
CPC ..... G02B 5/223; G02B 6/0026; G03F 7/0007; G03F 7/105; G03F 7/2053;
(Continued)

(56) References Cited

U.S. PATENT DOCUMENTS

| 5,725,989 A | 3/1998 | Chang et al. |
| 2007/0160776 A1* | 7/2007 | Kwon .................. C09D 11/36 |
| | | 428/1.1 |

(Continued)

FOREIGN PATENT DOCUMENTS

| JP | 2007-112139 A | 5/2007 |
| JP | 2007-182570 A | 7/2007 |

(Continued)

OTHER PUBLICATIONS

International Search Report, issued in PCT/JP2015/059817, dated Jun. 9, 2015.

(Continued)

Primary Examiner — Y M. Lee
(74) Attorney, Agent, or Firm — Birch, Stewart, Kolasch & Birch, LLP

(57) ABSTRACT

A liquid crystal display device containing a color filter layer, and a light-emitting device which contains a light source and a color conversion layer containing a quantum dot; wherein the color filter layer at least contains a blue color filter, a green color filter and a red color filter, as defined in the specification; an emission spectrum of light emitted from the light-emitting device has a first emission peak, a second emission peak and a third emission peak; the wavelength ($\lambda_1$) of the first emission peak ranges from 420 to 480 nm, the wavelength ($\lambda_2$) of the second emission peak ranges from 500 to 550 nm, and the wavelength ($\lambda_3$) of the third emission peak ranges from 580 to 650 nm.

4 Claims, 1 Drawing Sheet

(51) Int. Cl.
    *G03F 7/105* (2006.01)
    *G03F 7/20* (2006.01)
    *G02F 1/1335* (2006.01)
    *F21V 8/00* (2006.01)
    *G02B 5/20* (2006.01)

(52) U.S. Cl.
    CPC .. *G02F 1/133514* (2013.01); *G02F 1/133516* (2013.01); *G03F 7/0007* (2013.01); *G03F 7/105* (2013.01); *G03F 7/2053* (2013.01); *G02F 2001/133614* (2013.01); *G02F 2202/04* (2013.01); *G02F 2202/108* (2013.01); *G02F 2202/36* (2013.01)

(58) Field of Classification Search
    CPC ....... G02F 2001/13361; G02F 2202/04; G02F 2202/108; G02F 2203/05; G20F 2202/36
    See application file for complete search history.

(56) References Cited

U.S. PATENT DOCUMENTS

2009/0190064 A1    7/2009    Yamada et al.
2012/0113671 A1*   5/2012    Sadasivan ............ C09D 11/101
                                                  362/602
2015/0316815 A1*  11/2015    Kuriyama .............. C09K 19/20
                                                  349/106

FOREIGN PATENT DOCUMENTS

| JP | 2008-96471 A   | 4/2008  |
| JP | 2010-217895 A  | 9/2010  |
| JP | 2013-195538 A  | 9/2013  |
| JP | 2013-539598 A  | 10/2013 |
| JP | 2014-51641 A   | 3/2014  |

OTHER PUBLICATIONS

Taiwanese Office Action and Search Report (including an English translation thereof) issued in the corresponding Taiwanese Patent Application No. 104109426 dated Jun. 29, 2018.

Japanese Notice of Reasons for Rejection (including an English translation thereof) issued in the corresponding Japanese Patent Application No. 2016-510575 dated Jan. 8, 2019.

Chinese First Office Action (including a partial English trasnlation thereof) issued in the corresponding Chinese Patent Application No. 201580015422.9 dated Sep. 20, 2018.

* cited by examiner

LIQUID CRYSTAL DISPLAY DEVICE

TECHNICAL FIELD

The present invention relates to a liquid crystal display device.

BACKGROUND ART

A liquid crystal display device has been required to mount a high-lightness color filter thereon for the purpose of improving luminance thereof and reducing power consumption thereof. As such a liquid crystal display device, a liquid crystal display device provided with an LED as a light-emitting device is known (see JP-A-2008-96471 and others).

SUMMARY OF THE INVENTION

The present inventions include the following ones:

[1] A liquid crystal display device comprising:
  a color filter layer; and
  a light-emitting device which comprises a light source and a color conversion layer containing a quantum dot;
  wherein the color filter layer at least comprises a blue color filter, a green color filter and a red color filter,
  the red color filter is formed from a red-coloring composition comprising a coloring agent ($A_R$), a binder ($W_R$) and a solvent ($E_R$) and meets the requirement represented by formula (Q1): $0.1 \leq F_R \times C_R \leq 1.0$ [wherein $F_R$ represents the thickness (μm) of the red color filter; and $C_R$ represents the ratio of the amount of the coloring agent ($A_R$) to the total amount of the coloring agent ($A_R$) and the binder ($W_R$) in the red-coloring composition],
  the green color filter is formed from a green-coloring composition comprising a coloring agent ($A_G$), a binder ($W_G$) and a solvent ($E_G$) and meets the requirement represented by formula (Q2): $0.1 \leq F_G \times C_G \leq 1.2$ [wherein $F_G$ represents the thickness (μm) of the green color filter; and $C_G$ represents the ratio of the amount of the coloring agent ($A_G$) to the total amount of the coloring agent ($A_G$) and the binder ($W_G$) in the green-coloring composition],
  the blue color filter is formed from a blue-coloring composition comprising a coloring agent ($A_B$), a binder ($W_B$) and a solvent ($E_B$) and meets the requirement represented by formula (Q3): $0.1 \leq F_B \times C_B \leq 1.0$ [wherein $F_B$ represents the thickness (μm) of the blue color filter; and $C_B$ represents the ratio of the amount of the coloring agent ($A_B$) to the total amount of the coloring agent ($A_B$) and the binder ($W_B$) in the blue-coloring composition],
  an emission spectrum of light emitted from the light-emitting device has a first emission peak, a second emission peak and a third emission peak,
  the wavelength ($\lambda_1$) of the first emission peak ranges from 420 to 480 nm,
  the wavelength ($\lambda_2$) of the second emission peak ranges from 500 to 550 nm, and
  the wavelength ($\lambda_3$) of the third emission peak ranges from 580 to 650 nm.

[2] The display device according to [1], wherein the light source is a light source capable of emitting light which has an emission peak in the wavelength range from 420 to 480 nm.

[3] A color filter layer at least comprising a blue color filter, a green color filter and a red color filter,
  wherein the red color filter is formed from a red-coloring composition comprising a coloring agent ($A_R$), a binder ($W_R$) and a solvent ($E_R$) and meets the requirement represented by formula (Q1): $0.1 \leq F_R \times C_R \leq 1.0$ [wherein $F_R$ represents the thickness (μm) of the red color filter; and $C_R$ represents the ratio of the amount of the coloring agent ($A_R$) to the total amount of the coloring agent ($A_R$) and the binder ($W_R$) in the red-coloring composition],
  the green color filter is formed from a green-coloring composition comprising a coloring agent ($A_G$), a binder ($W_G$) and a solvent ($E_G$) and meets the requirement represented by formula (Q2): $0.1 \leq F_G \times C_G \leq 1.2$ [wherein $F_G$ represents the thickness (μm) of the green color filter; and $C_G$ represents the ratio of the amount of the coloring agent ($A_G$) to the total amount of the coloring agent ($A_G$) and the binder ($W_G$) in the green-coloring composition],
  the blue color filter is formed from a blue-coloring composition comprising a coloring agent ($A_B$), a binder ($W_B$) and a solvent ($E_B$) and meets the requirement represented by formula (Q3): $0.1 \leq F_B \times C_B \leq 1.0$ [wherein $F_B$ represents the thickness (μm) of the blue color filter; and $C_B$ represents the ratio of the amount of the coloring agent ($A_B$) to the total amount of the coloring agent ($A_B$) and the binder ($W_B$) in the blue-coloring composition],
  the color filter layer being to be used for a liquid crystal display device equipped with a light-emitting device which comprises a light source and a color conversion layer containing a quantum dot.

[4] A method for producing a red color filter in the liquid crystal display device as defined in [1], comprising the step of applying a red-coloring composition comprising a coloring agent ($A_R$), a binder ($W_R$) and a solvent ($E_R$) onto a substrate,
  wherein the red color filter meets the requirement represented by formula (Q1): $0.1 \leq F_R \times C_R \leq 1.0$ [wherein $F_R$ represents the thickness (μm) of the red color filter; and $C_R$ represents the ratio of the amount of the coloring agent ($A_R$) to the total amount of the coloring agent ($A_R$) and the binder ($W_R$) in the red-coloring composition].

[5] The method according to [4], wherein the coloring agent ($A_R$) comprises a dye selected from the group consisting of an azo dye, an azo metal complex dye, a xanthene dye and a coumarin dye and a pigment selected from the group consisting of a diketopyrrolopyrrole pigment, an azo pigment, an anthraquinone pigment, a quinophthalone pigment, an isoindoline pigment and an azomethine pigment.

[6] A method for producing a green color filter in the liquid crystal display device as defined in [1], comprising the step of applying a green-coloring composition comprising a coloring agent ($A_G$), a binder ($W_G$) and a solvent ($E_G$) onto a substrate,
  wherein the green color filter meets the requirement represented by formula (Q2): $0.1 \leq F_G \times C_G \leq 1.2$ [wherein $F_G$ represents the thickness (μm) of the green color filter; and $C_G$ represents the ratio of the amount of the coloring agent ($A_G$) to the total amount of the coloring agent ($A_G$) and the binder ($W_G$) in the green-coloring composition].

[7] The method according to [6], wherein the coloring agent ($A_G$) comprises a dye selected from the group consisting of a phthalocyanine dye, a triarylmethane dye and a squarylium dye and a phthalocyanine pigment.

[8] A method for producing a blue color filter in the liquid crystal display device as defined in claim 1, comprising the step of applying a blue-coloring composition comprising a coloring agent ($A_B$), a binder ($W_B$) and a solvent ($E_B$) onto a substrate,
  wherein the blue color filter meets the requirement represented by formula (Q3): $0.1 \leq F_B \times C_B \leq 1.0$ [wherein $F_B$ represents the thickness (μm) of the blue color filter; and $C_B$ represents the ratio of the amount of the coloring agent ($A_B$)

to the total amount of the coloring agent ($A_B$) and the binder ($W_B$) in the blue-coloring composition].

[9] The method according to [8], wherein the coloring agent ($A_B$) comprises a dye selected from the group consisting of a phthalocyanine dye, a triarylmethane dye, an anthraquinone dye, a xanthene dye and a methine dye and a pigment selected from the group consisting of a phthalocyanine pigment, an anthraquinone pigment and a dioxazine pigment.

According to the liquid crystal display device of the present invention, high color reproducibility and high luminance can be achieved, and the yield in the production of the liquid crystal display device can be improved because of its better chemical resistance and better resolution at the time of producing color filters.

MODE FOR CARRYING OUT THE INVENTION

Figure 1:
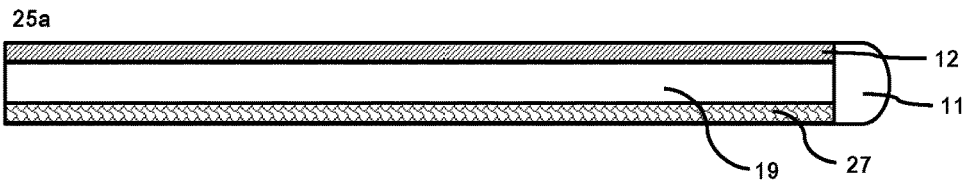
FIG. 1 illustrates one example of a light-emitting device to be used in the liquid crystal display device according to the present invention.

The liquid crystal display device according to the present invention comprises:

a color filter layer at least comprising a blue color filter, a green color filter and a red color filter; and a light-emitting device, which is also sometimes referred to as "light-emitting device (Y)" hereinbelow, comprising a light source (L) and a color conversion layer (M) containing a quantum dot.

The red color filter is formed from a red-coloring composition comprising a coloring agent ($A_R$), a binder ($W_R$) and a solvent ($E_R$).

The green color filter is formed from a green-coloring composition comprising a coloring agent ($A_G$), a binder ($W_G$) and a solvent ($E_G$).

The blue color filter is formed from a blue-coloring composition comprising a coloring agent ($A_B$), a binder ($W_B$) and a solvent ($E_B$).

Hereinbelow, the coloring agent ($A_R$), the coloring agent ($A_G$) and the coloring agent ($A_B$) are collectively referred to as a "coloring agent (A)", the binder ($W_R$), the binder ($W_G$) and the binder ($W_B$) are collectively referred to as a "binder (W)", and the solvent ($E_R$), the solvent ($E_G$) and the solvent ($E_B$) are collectively referred to as a "solvent (E)".

The red-coloring composition, the green-coloring composition and the blue-coloring composition are sometimes collectively referred to as a "coloring composition (Z)".

<Coloring Composition (Z)>

The coloring agent (A) includes a pigment and a dye.

The term "pigment" as used herein means a coloring matter insoluble or poorly soluble in a solvent.

The term "dye" as used herein means a coloring matter soluble in a solvent. The dye to be used in the present invention is preferably a dye soluble in an organic solvent.

The term "coloring matter" as used herein is a generic name for a pigment and a dye.

Examples of the pigment include a pigment classified as "Pigment" in the Color Index (published by The Society of Dyers and Colourists), a diketopyrrolopyrrole pigment, an azo pigment, an anthraquinone pigment, a quinophthalone pigment, an isoindoline pigment and an azomethine pigment.

Specific examples include a yellow pigment such as C. I. Pigment Yellow 1 (hereinbelow, the term "C. I. Pigment Yellow" is omitted and only the number is shown; ditto for other pigment names), 3, 12, 13, 14, 15, 16, 17, 20, 24, 31, 53, 74, 81, 83, 86, 93, 94, 109, 110, 117, 125, 127, 128, 129, 137, 138, 139, 147, 148, 150, 153, 154, 166, 173, 180, 185, 194, 214 and 215;

an orange pigment such as C. I. Pigment Orange 13, 31, 36, 38, 40, 42, 43, 51, 55, 59, 61, 64, 65, 71 and 73;

a red pigment such as C. I. Pigment Red 9, 65, 81, 97, 105, 122, 123, 144, 149, 166, 168, 170, 176, 177, 178, 180, 187, 192, 209, 215, 216, 224, 242, 254, 255, 264, 265, 270 and 272;

a blue pigment such as C. I. Pigment Blue 15, 15:3, 15:4, 15:6, 16, 60, 79 and 80;

a violet pigment such as C. I. Pigment Violet 1, 19, 23, 29, 32, 36, 37 and 38;

a green pigment such as C. I. Pigment Green 7, 36 and 58;

a brown pigment such as C. I. Pigment Brown 23 and 25; and a black pigment such as C. I. Pigment Black 1 and 7.

The examples further include phthalocyanine pigments described in JP-A-2004-70342, JP-A-2008-19383 and JP-A-2007-320986.

The dye is not particularly limited, and any known dye can be used. Examples of the dye include a solvent dye, an acidic dye, a direct dye and a mordant dye. The dye is also exemplified by a compound that is not a pigment but classified into a compound having a hue in the Color Index (published by The Society of Dyers and Colourists), and a known dye as described in "Dying note (Shikisensha Co., Ltd.)". According to the classification on the basis of chemical structures, it includes an azo dye, a cyanine dye, a triarylmethane dye, a xanthene dye, a phthalocyanine dye, an anthraquinone dye, a naphthoquinone dye, a quinonimine dye, a polymethine dye, an azomethine dye, a squarylium dye, an acridine dye, a styryl dye, a coumarin dye, a quinoline dye and a nitro dye.

Specific examples are as follows:

C. I. Solvent dyes including:

C. I. Solvent Yellow 4, 14, 15, 23, 24, 38, 62, 63, 68, 82, 94, 98, 99, 117, 162, 163, 167 and 189;

C. I. Solvent Orange 2, 7, 11, 15, 26, 56, 77, 86 and 112;

C. I. Solvent Red 45, 49, 111, 125, 130, 143, 145, 146, 150, 151, 155, 160, 168, 169, 172, 175, 181, 207, 218, 222, 227, 230, 245 and 247;

C. I. Solvent Violet 11, 13, 14, 26, 31, 36, 37, 38, 45, 47, 48, 51, 59 and 60;

C. I. Solvent Blue 2, 4, 5, 14, 18, 25, 35, 36, 37, 38, 43, 44, 45, 58, 59, 59:1, 63, 64, 67, 68, 69, 70, 78, 79, 83, 90, 94, 97, 98, 100, 101, 102, 104, 105, 111, 112, 122, 124, 128, 132, 136 and 139; and C. I. Solvent Green 1, 3, 4, 5, 7, 28, 29, 32, 33, 34 and 35;

C. I. Acid dyes including:

C. I. Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 227, 228, 230, 232, 235, 238, 240, 242, 243, 250 and 251;

C. I. Acid Orange 6, 7, 8, 10, 12, 26, 50, 51, 52, 56, 62, 63, 64, 74, 75, 94, 95, 107, 108, 169 and 173;

C. I. Acid Red 1, 4, 8, 14, 17, 18, 26, 27, 29, 31, 33, 34, 35, 37, 40, 42, 44, 50, 51, 52, 57, 66, 73, 76, 80, 87, 88, 91, 92, 94, 95, 97, 98, 103, 106, 111, 114, 129, 133, 134, 138, 143, 145, 150, 151, 155, 158, 160, 172, 176, 182, 183, 195, 198, 206, 211, 215, 216, 217, 227, 228, 249, 252, 257, 258, 260, 261, 266, 268, 270, 274, 277, 280, 281, 289, 308, 312, 315, 316, 339, 341, 345, 346, 349, 382, 383, 388, 394, 401, 412, 417, 418, 422 and 426;

C. I. Acid Violet 6B, 7, 9, 15, 16, 17, 19, 21, 23, 24, 25, 30, 34, 38, 49, 72 and 102;

C. I. Acid Blue 1, 3, 5, 7, 9, 11, 13, 15, 17, 18, 22, 23, 24, 25, 26, 27, 29, 34, 38, 40, 41, 42, 43, 45, 48, 51, 54, 59, 60, 62, 70, 72, 74, 75, 78, 80, 82, 83, 86, 87, 88, 90, 90:1, 91, 92, 93, 93:1, 96, 99, 100, 102, 103, 104, 108, 109, 110, 112, 113, 117, 119, 120, 123, 126, 127, 129, 130, 131, 138, 140, 142, 143, 147, 150, 151, 154, 158, 161, 166, 167, 168, 170, 171, 175, 182, 183, 184, 185, 187, 192, 199, 203, 204, 205, 210, 213, 229, 234, 236, 242, 243, 249, 256, 259, 267, 269, 278, 280, 285, 290, 296, 315, 324:1, 335 and 340; and C. I. Acid Green 1, 3, 5, 6, 7, 8, 9, 11, 13, 14, 15, 16, 22, 25, 27, 28, 41, 50, 50:1, 58, 63, 65, 80, 104, 105, 106 and 109;

C. I. Direct dyes including:

C. I. Direct Yellow 2, 33, 34, 35, 38, 39, 43, 47, 50, 54, 58, 68, 69, 70, 71, 86, 93, 94, 95, 98, 102, 108, 109, 129, 136, 138 and 141;

C. I. Direct Orange 26, 34, 39, 41, 46, 50, 52, 56, 57, 61, 64, 65, 68, 70, 96, 97, 106 and 107;

C. I. Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, and 250;

C. I. Direct Violet 47, 52, 54, 59, 60, 65, 66, 79, 80, 81, 82, 84, 89, 90, 93, 95, 96, 103 and 104;

C. I. Direct Blue 1, 2, 3, 6, 8, 15, 22, 25, 28, 29, 40, 41, 42, 47, 52, 55, 57, 71, 76, 77, 78, 80, 81, 84, 85, 86, 87, 90, 93, 94, 95, 97, 98, 99, 100, 101, 106, 107, 108, 109, 113, 114, 115, 117, 119, 120, 137, 149, 150, 153, 155, 156, 158, 159, 160, 161, 162, 163, 164, 165, 166, 167, 168, 170, 171, 172, 173, 188, 189, 190, 192, 193, 194, 195, 196, 198, 199, 200, 201, 202, 203, 207, 209, 210, 212, 213, 214, 222, 225, 226, 228, 229, 236, 237, 238, 242, 243, 244, 245, 246, 247, 248, 249, 250, 251, 252, 256, 257, 259, 260, 268, 274, 275 and 293; and C. I. Direct Green 25, 27, 31, 32, 34, 37, 63, 65, 66, 67, 68, 69, 72, 77, 79 and 82;

C. I. Disperse dyes including:

C. I. Disperse Yellow 51, 54, 76, 82 and 184;

C. I. Disperse Violet 26 and 27; and

C. I. Disperse Blue 1, 14, 56 and 60;

C. I. Basic dyes including:

C. I. Basic Red 1, 9 and 10;

C. I. Basic Violet 2 and 10;

C. I. Basic Blue 1, 3, 5, 7, 9, 19, 21, 22, 24, 25, 26, 28, 29, 40, 41, 45, 47, 54, 58, 59, 60, 64, 65, 66, 67, 68, 81, 83, 88 and 89; and C. I. Basic Green 1;

C. I. Reactive dyes including:

C. I. Reactive Yellow 2, 76 and 116;

C. I. Reactive Orange 16; and

C. I. Reactive Red 36;

C. I. Mordant dyes including:

C. I. Mordant Yellow 5, 8, 10, 16, 20, 26, 30, 31, 33, 42, 43, 45, 56, 61, 62 and 65;

C. I. Mordant Orange 3, 4, 5, 8, 12, 13, 14, 20, 21, 23, 24, 28, 29, 32, 34, 35, 36, 37, 42, 43, 47 and 48;

C. I. Mordant Red 1, 2, 3, 4, 9, 11, 12, 14, 17, 18, 19, 22, 23, 24, 25, 26, 27, 29, 30, 32, 33, 36, 37, 38, 39, 41, 42, 43, 45, 46, 48, 52, 53, 56, 62, 63, 71, 74, 76, 78, 85, 86, 88, 90, 94 and 95;

C. I. Mordant Violet 1, 1:1, 2, 3, 4, 5, 6, 7, 8, 10, 11, 14, 15, 16, 17, 18, 19, 21, 22, 23, 24, 27, 28, 30, 31, 32, 33, 36, 37, 39, 40, 41, 44, 45, 47, 48, 49, 53 and 58;

C. I. Mordant Blue 1, 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83 and 84; and C. I. Mordant Green 1, 3, 4, 5, 10, 13, 15, 19, 21, 23, 26, 29, 31, 33, 34, 35, 41, 43 and 53; and C. I. Vat dyes including:

C. I. Vat Green 1.

In addition, specific examples further include phthalocyanine dyes described in JP-A-5-333207, JP-A-6-51115, JP-A-6-194828 and JP-A-2012-67229;

triarylmethane dyes described in JP-4492760;

xanthene dyes described in JP-A-2010-32999, JP-4492760, and JP-A-2013-64096;

methine dyes described in JP-A-2008-242325;

coumarin dyes described in JP-1299948 and JP-A-2013-231165.

In the coloring agent (A) to be used in the red-coloring composition [wherein the coloring agent (A) is sometimes referred to as a "coloring agent $(A_R)$", hereinbelow], the pigment is preferably a diketopyrrolopyrrole pigment, an azo pigment, an anthraquinone pigment, a quinophthalone pigment, an isoindoline pigment or an azomethine pigment. The hue of the pigment preferably includes orange and yellow in addition to red.

Examples of the diketopyrrolopyrrole pigment include C. I. Pigment Orange 71 and 73, C. I. Pigment Red 254, 255, 264, 270 and 272, and pigments described in JP2011-523433.

Examples of the azo pigment include: a monoazo pigment such as C. I. Pigment Yellow 1, 3, 74, 150, 180 and 194, C. I. Pigment Orange 36, 38 and 64, C. I. Pigment Red 9, 170, 176 and 187, and C. I. Pigment Brown 25; and a disazo pigment such as C. I. Pigment Yellow 12, 13, 14, 16, 17, 81, 83, 93, 94, 127, 128, 166 and 180, C. I. Pigment Orange 13, C. I. Pigment Red 144, 166 and 242, and C. I. Pigment Brown 23.

Examples of the anthraquinone pigment include C. I. Pigment Yellow 147, and C. I. Pigment Red 177.

An example of the quinophthalone pigment is C. I. Pigment Yellow 138.

Examples of the isoindoline pigment include C. I. Pigment Yellow 109, 110, 139, 173 and 185, and C. I. Pigment Orange 61.

Examples of the azomethine pigment include C. I. Pigment Yellow 129, and C. I. Pigment Red 65.

In the coloring agent $(A_R)$, the dye is preferably an azo dye, an azo metal complex dye, a xanthene dye or a coumarin dye. The hue of the coloring agent $(A_R)$ preferably includes orange and yellow in addition to red.

Examples of the azo dye include C. I. Solvent Yellow 4, 14, 15, 23, 24, 68, 99 and 162; C. I. Solvent Orange 2 and 7; C. I. Solvent Red 125; C. I. Acid Yellow 9, 11, 17, 23, 25, 29, 34, 36, 38, 40, 42, 65, 72, 76, 135, 144, 168, 169, 172, 178, 190 and 193; C. I. Acid Orange 6, 7, 8, 10, 12, 50, 51, 52, 56, 63, 94 and 95; C. I. Acid Red 1, 4, 8, 14, 17, 18, 26, 27, 29, 31, 33, 34, 35, 37, 40, 42, 44, 57, 66, 73, 76, 88, 97, 106, 111, 114, 133, 134, 138, 150, 151, 155, 158, 160, 172, 176, 228, 249, 252, 257, 260, 261, 266, 274 and 280; C. I.

Direct Yellow 2, 33, 34, 35, 50, 69, 70, 71, 86, 93, 94, 95, 98, 102, 109, 129 and 136; C. I. Direct Orange 26, 50, 56, 64, 96, 97, 106 and 107; C. I. Direct Red 79, 83, 84, 97, 98, 107, 172, 173, 176, 177, 179, 181, 182, 204, 207, 211, 213, 218, 221, 222, 232, 233 and 234; C. I. Disperse Yellow 76; C. I. Reactive Yellow 2 and 76; C. I. Reactive Orange 16; C. I. Reactive red 36; C. I. Mordant Yellow 8, 10, 16, 20, 26, 30, 31, 42, 43, 45, 61 and 62; C. I. Mordant Orange 3, 4, 8, 12, 24, 28, 29, 32, 35, 36, 37, 42, 43 and 48; and C. I. Mordant Red 1, 9, 12, 14, 17, 18, 19, 23, 24, 25, 26, 30, 32, 33, 36, 37, 39, 41, 43, 48, 71, 74, 85, 86, 88, 90, 94 and 95.

Examples of the azo metal complex dye include C. I. Solvent Yellow 82; C. I. Solvent Orange 11 and 56; C. I. Solvent Red 130; C. I. Acid Yellow 123, 128, 134, 138, 139, 140, 150, 160, 177 and 179; C. I. Acid Orange 107 and 108; C. I. Acid Red 211, 258, 268, 270, 277, 281, 308, 312, 315, 316, 339, 341, 346 and 349; and C. I. Direct Red 99 and 106.

Examples of the xanthene dye include C. I. Solvent Yellow 98; C. I. Solvent Red 45 an 49; C. I. Acid Red 50, 51, 52, 87, 91, 92, 94, 95, 98 and 289; C. I. Basic Red 1; and C. I. Mordant Red 27.

The coloring agent ($A_R$) preferably contains a dye selected from the group consisting of an azo dye, an azo metal complex dye, a xanthene dye and a coumarin dye and a pigment selected from the group consisting of a diketopyrrolopyrrole pigment, an azo pigment, an anthraquinone pigment, a quinophthalone pigment, an isoindoline pigment and an azomethine pigment.

In the red-coloring composition, examples of the preferred combination for the coloring agent ($A_R$) include a diketopyrrolopyrrole pigment/a quinophthalone pigment, a diketopyrrolopyrrole pigment/an isoindoline pigment, a diketopyrrolopyrrole pigment/an azomethine pigment, a diketopyrrolopyrrole pigment/an azo pigment, an azo pigment/a diketopyrrolopyrrole pigment/a quinophthalone pigment, an azo pigment/a quinophthalone pigment, an azo pigment/an azomethine pigment, an azo pigment/an isoindoline pigment; a diketopyrrolopyrrole pigment/a coumarin dye, a diketopyrrolopyrrole pigment/an azo dye, an azo pigment/a coumarin dye, an azo pigment/an azo dye, an azomethine pigment/an azo metal complex dye, a quinophthalone pigment/an azo metal complex dye, an isoindoline pigment/an azo metal complex dye, an azo pigment/an azo metal complex dye, an azomethine pigment/a xanthene dye, an azo pigment/a xanthene dye; and an azo metal complex dye/a coumarin dye, an azo metal complex dye/an azo dye, a xanthene dye/a coumarin dye, a xanthene dye/an azo dye, and an azo metal complex dye/a xanthene dye, more preferably a diketopyrrolopyrrole pigment/an isoindoline pigment, a diketopyrrolopyrrole pigment/an azo pigment, an azo pigment/a quinophthalone pigment, an azo pigment/an isoindoline pigment, an azo pigment/a coumarin dye, an azo pigment/an azo metal complex dye, an azo metal complex dye/a coumarin dye, and a xanthene dye/a coumarin dye. A liquid crystal display device having high luminance can be produced by applying thereto a red color filter formed from a red-coloring composition which comprises a coloring agent comprising any one of the above-mentioned combinations.

In the coloring agent (A) to be used in the green-coloring composition [wherein the coloring agent (A) is sometimes referred to as a "coloring agent ($A_G$)", hereinbelow], the pigment is preferably a phthalocyanine pigment or the like, more preferably a halogenated phthalocyanine pigment.

Examples of the phthalocyanine pigment include C. I. Pigment Green 7, 36 and 58, C. I. Pigment Blue 79, and pigments described in JP-A-2004-70342, JP-A-2008-19383 and JP-A-2007-320986.

In the coloring agent ($A_G$), a phthalocyanine dye, a triarylmethane dye, a squarylium dye or the like is preferred as the dye.

Examples of the phthalocyanine dye include C. I. Solvent Green; and dyes described in JP-A-2012-67229.

Examples of the triarylmethane dye include C. I. Solvent Green 1; C. I. Acid Green 25, 27 and 41; C. I. Basic Green 1; and C. I. Mordant Green 3, 13, 21, 23 and 31.

Examples of the squarylium dye include dyes described in KR-A-2012-13945, KR-A-10-2013-0072953 and KR-A-10-2013-0074363.

Preferably, the coloring agent ($A_G$) further contains a yellow coloring matter in addition to the above-mentioned coloring matter. Among the yellow coloring matters, a yellow pigment is preferably an azo pigment, a quinophthalone pigment, an isoindoline pigment or an azomethine pigment.

Examples of the azo pigment include C. I. Pigment Yellow 1, 3, 12, 13, 14, 16, 17, 74, 81, 83, 93, 94, 127, 128, 150, 166, 180 and 194.

An example of the quinophthalone pigment is C. I. Pigment Yellow 138.

Examples of the isoindoline pigment include C. I. Pigment Yellow 109, 110, 139, 173 and 185.

An example of the azomethine pigment is C. I. Pigment Yellow 129.

The yellow dye is preferably an azo dye, a coumarin dye, a polymethine dye, a quinoline dye or a styryl dye.

The coloring agent ($A_G$) preferably contains a dye selected from the group consisting of a phthalocyanine dye, a triarylmethane dye and a squarylium dye and a phthalocyanine pigment.

In the green-coloring composition, examples of the preferred combination for the coloring agent ($A_G$) include a phthalocyanine pigment/an azomethine pigment, a phthalocyanine pigment/an isoindoline pigment, a phthalocyanine pigment/an azo pigment, a phthalocyanine pigment/a phthalocyanine dye, a phthalocyanine pigment/a coumarin dye, a phthalocyanine pigment/an azo dye, an azomethine pigment/a phthalocyanine dye, an isoindoline pigment/a phthalocyanine dye, a phthalocyanine pigment/a squarylium dye, an isoindoline pigment/a squarylium dye, an isoindoline pigment/a squarylium dye/a coumarin dye, a phthalocyanine pigment/a squarylium dye/a coumarin dye, a phthalocyanine dye/a coumarin dye, a phthalocyanine dye/an azo dye, a squarylium dye/a coumarin dye, and a squarylium dye/an azo dye, more preferably a phthalocyanine pigment/an isoindoline pigment, a phthalocyanine pigment/a coumarin dye, an isoindoline pigment/a squarylium dye/a coumarin dye, and a phthalocyanine pigment/a squarylium dye/a coumarin dye. A liquid crystal display device having high luminance can be produced by applying thereto a green color filter formed from a green-coloring composition which comprises a coloring agent comprising any one of the above-mentioned combinations.

In the coloring agent (A) to be used in the blue-coloring composition [wherein the coloring agent (A) is sometimes referred to as a "coloring agent ($A_B$)", hereinbelow], the pigment is preferably a phthalocyanine pigment, an anthraquinone pigment or a dioxazine pigment.

Examples of the phthalocyanine pigment include C. I. Pigment Blue 15, 15:3, 15:4, 15:6, 16 and 79, and pigments described in JP-A-2004-70342, JP-A-2008-19383 and JP-A-2007-320986.

An example of the anthraquinone pigment is C. I. Pigment Blue 60.

Examples of the dioxazine pigment include C. I. Pigment Blue 80, and C. I. Pigment Violet 23 and 37.

In the coloring agent ($A_B$), the dye is preferably a phthalocyanine dye, a triarylmethane dye, an anthraquinone dye, a xanthene dye or a methine dye. The hue of the coloring agent ($A_B$) preferably includes purple and red in addition to blue.

Examples of the phthalocyanine dye include C. I. Solvent Blue 25, 38, 44, 64, 67 and 70; C. I. Acid Blue 185, 242, 243 and 249; C. I. Direct Blue 86, 87, 189 and 194; and C. I. Mordant Blue 77.

Examples of the triarylmethane dye include C. I. Solvent Blue 2, 4, 5 and 43; C. I. Acid Blue 1, 3, 5, 7, 9, 11, 13, 15, 17, 22, 24, 26, 34, 48, 75, 83, 86, 88, 90, 90:1, 91, 93, 99.100, 103, 104, 108, 109, 110, 119, 123, 147, 213 and 269; C. I. Acid Violet 15, 16, 17, 19, 21, 23, 24, 25, 38, 49 and 72; C. I. Basic Blue 1, 3, 7, 26, 81, 83, 88 and 89; C. I. Basic Violet 2; C. I. Mordant Blue 1 and 3; and C. I. Mordant Violet 1, 3, 6, 8, 10, 11, 15, 16, 17, 18, 19, 21, 23, 27, 28, 33, 36, 39 and 49.

Examples of the anthraquinone dye include C. I. Solvent Blue 14, 18, 36, 45, 58, 59, 63, 68, 69, 78, 79 and 83; C. I. Solvent Violet 11, 13, 14 and 26; C. I. Solvent Red 111, 143, 145, 146, 150 and 151; C. I. Acid Blue 23, 25, 27, 40, 41, 43, 45, 51, 54, 62, 78, 80, 96, 127, 129, 138, 143, 150, 175, 203, 204, 205, 278 and 280; C. I. Acid Violet 34; C. I. Disperse Blue 1, 14, 56 and 60; C. I. Disperse Violet 26 and 27; and C. I. Mordant Blue 8, 23, 24, 32, 48 and 74.

Examples of the xanthene dye include, in addition to the above-mentioned red xanthene dyes, C. I. Acid Violet 9, 30 and 102; C. I. Basic Violet 10; and dyes described in JP-A-2010-32999, JP-4492760 and JP-A-2013-64096.

Examples of the methine dye include dyes described in JP-A-2008-242325.

The coloring agent ($A_B$) preferably contains a dye selected from the group consisting of a phthalocyanine dye, a triarylmethane dye, an anthraquinone dye, a xanthene dye and a methine dye and a pigment selected from the group consisting of a phthalocyanine pigment, an anthraquinone pigment and a dioxazine pigment.

In the blue-coloring composition, examples of the preferred combination for the coloring agent ($A_B$) include a phthalocyanine pigment/a dioxazine pigment, a phthalocyanine pigment/a xanthene dye, a phthalocyanine pigment/a triarylmethane dye, a triarylmethane dye/a xanthene dye, and a methine dye/a xanthene dye, more preferably a phthalocyanine pigment/a xanthene dye, and a triarylmethane dye/a xanthene dye. A liquid crystal display device having high luminance can be obtained by applying thereto a blue color filter formed from a blue-coloring composition which comprises a coloring agent comprising any one of the above-mentioned combinations.

In each of the coloring compositions, the amount of the coloring agent (A) is preferably 5 to 65% by mass, more preferably 8 to 60% by mass, still more preferably 10 to 55% by mass, relative to the solid content.

When the amount of the coloring agent (A) falls within the above-mentioned range, the color filter produced has sufficient color density, and further a binder (W) can be added in a desired amount to the composition so as to form a color filter which has excellent durability including mechanical strength and chemical resistance.

The term "solid content" as used herein means the total amount of the coloring agent (A) and the binder (W). The solid content and the amount of each of the components can be determined by a known analysis means such as liquid chromatography and gas chromatography.

The coloring composition (Z) preferably contains a resin (B) and a polymerizable compound (C), more preferably additionally contains a polymerization initiator (D), as the binder (W).

The resin (B) is not particularly limited, and is preferably an alkali-soluble resin. Examples of the resin (B) include the following resins [K1] to [K6]:

a resin [K1]; a copolymer of at least one component (a) (which is also referred to as "(a)", hereinbelow) selected from the group consisting of an unsaturated carboxylic acid and an unsaturated carboxylic anhydride and a monomer (b) (which is also referred to as "(b)", hereinbelow) having a cyclic ether structure having 2 to 4 carbon atoms and an ethylenically unsaturated bond;

a resin [K2]; a copolymer of (a), (b) and a monomer copolymerizable with (a) (which is different from (a) and (b)) (wherein the component is also referred to as "(c)", hereinbelow);

a resin [K3]; a copolymer of (a) and (c);

a resin [K4]; a resin produced by reacting a copolymer of (a) and (c) with (b);

a resin [K5]; a resin produced by reacting a copolymer of (b) and (c) with (a); and a resin [K6]; a resin produced by reacting a copolymer of (b) and (c) with (a) to produce a reaction product and then reacting the reaction product with a carboxylic anhydride.

Examples of (a) include a carboxylic acid such as acrylic acid, methacrylic acid, crotonic acid, o-, m- or p-vinylbenzoic acid, maleic acid, fumaric acid, citraconic acid, mesaconic acid, itaconic acid, 3-vinylphthalic acid, 4-vinylphthalic acid, 3,4,5,6-tetrahydrophthalic acid, 1,2,3,6-tetrahydrophthalic acid, dimethyltetrahydrophthalic acid, 1,4-cyclohexenedicarboxylic acid and methyl-5-norbornene-2,3-dicarboxylic acid; and a carboxylic anhydride such as maleic anhydride, citraconic anhydride, itaconic anhydride, 3-vinylphthalic anhydride, 4-vinylphthalic anhydride, 3,4,5,6-tetrahydrophthalic anhydride, 1,2,3,6-tetrahydrophthalic anhydride, dimethyltetrahydrophthalic anhydride, and 5,6-dicarboxybicyclo[2.2.1]hept-2-ene anhydride.

Examples of (b) include a monomer having an oxiranyl group and an ethylenically unsaturated bond, such as glycidyl (meth)acrylate, β-methylglycidyl (meth)acrylate, β-ethylglycidyl(meth)acrylate, glycidyl vinyl ether, vinylbenzyl glycidyl ether, α-methylvinylbenzyl glycidyl ether, 2,3-bis(glycidyloxymethyl)styrene, 2,4-bis(glycidyloxymethyl)styrene, 2,5-bis(glycidyloxymethyl)styrene, 2,6-bis(glycidyloxymethyl)styrene, 2,3,4-tris(glycidyloxymethyl)styrene, 2,3,5-tris(glycidyloxymethyl)styrene, 2,3,6-tris(glycidyloxymethyl)styrene, 3,4,5-tris(glycidyloxymethyl)styrene, 2,4,6-tris(glycidyloxymethyl)styrene, vinylcyclohexene monoxide, 1,2-epoxy-4-vinylcyclohexane (e.g., CELLOXIDE (registered trade name) 2000; manufactured by Daicel Corporation), 3,4-epoxycyclohexylmethyl (meth)acrylate (e.g., Cyclomer (registered trade name) A400; manufactured by Daicel Corporation), 3,4-epoxycyclohexylmethyl (meth)acrylate (e.g., Cyclomer (registered trade name) M100; manufactured by Daicel Corporation) and 3,4-epoxytricyclo[5.2.1.0$^{2,6}$]decyl (meth)acrylate;

a monomer having an oxetanyl group an ethylenically unsaturated bond, such as 3-methyl-3-(meth)acryloyloxymethyloxetane, 3-ethyl-3-(meth)acryloyloxymethyloxetane, 3-methyl-3-(meth)acryloyloxyethyloxetane and 3-ethyl-3-(meth)methacryloyloxyethyloxetane; and a monomer having a tetrahydrofuryl group and an ethylenically unsaturated bond, such as tetrahydrofurfuryl acrylate (e.g., Viscoat V#150, manufactured by Osaka Organic Chemical Industry Ltd.) and tetrahydrofurfuryl methacrylate.

Examples of (c) include methyl (meth)acrylate, ethyl (meth)acrylate, n-butyl (meth)acrylate, sec-butyl (meth)acrylate, tert-butyl (meth)acrylate, 2-ethylhexyl (meth)acrylate, dodecyl (meth)acrylate, lauryl(meth)acrylate, stearyl (meth)acrylate, cyclopentyl(meth)acrylate, cyclohexyl (meth)acrylate, 2-methylcyclohexyl(meth)acrylate, tricyclo[5.2.1.0$^{2,6}$]decan-8-yl(meth)acrylate (which has a trivial name "dicyclopentanyl(meth)acrylate" in the art; sometimes referred to as "tricyclodecyl(meth)acrylate"), tricyclo[5.2.1.0$^{2,6}$]decene-8-yl(meth)acrylate (which has a trivial name "dicyclopentenyl(meth)acrylate" in the art), dicyclopentanyloxyethyl(meth)acrylate, isobornyl (meth)acrylate, adamantyl(meth)acrylate, allyl (meth)acrylate, propargyl (meth)acrylate, phenyl (meth)acrylate, naphthyl(meth)acrylate, benzyl (meth)acrylate, 2-hydroxyethyl(meth)acrylate, 2-hydroxypropyl(meth)acrylate, diethyl maleate, diethyl fumarate, diethyl itaconate, bicyclo[2.2.1]hept-2-ene, N-phenylmaleimide, N-cyclohexylmaleimide, N-benzylmaleimide, styrene, α-methylstyrene, vinyltoluene, p-methoxystyrene, (meth)acrylonitrile, vinyl chloride, vinylidene chloride, (meth)acrylamide, vinyl acetate, 1,3-butadiene, isoprene and 2,3-dimethyl-1,3-butadiene.

The resins [K1] to [K3] can be produced in accordance with the method described in a document "Experimental Method for Polymer Synthesis" (edited by Takayuki Otsu, published by Kagaku Dojin Publishing Co., Ltd., First Edition, First Printed on Mar. 1, 1972) and documents cited in the above-mentioned document.

The resin [K4] can be produced by producing a copolymer of (a) and (c) and then adding a cyclic ether having 2 to 4 carbon atoms in (b) to a carboxylic acid and/or a carboxylic anhydride in (a) in the copolymer.

The resin [K5] can be produced by producing a copolymer of (b) and (c) and then reacting a cyclic ether derived from (b) in the copolymer with a carboxylic acid and/or a carboxylic anhydride in (a).

The resin [K6] can be produced by further reacting resin [K5] with a carboxylic anhydride. Examples of the carboxylic anhydride include compounds which are mentioned as the carboxylic anhydrides for (a).

Specific examples of the resin (B) include: a resin [K1] such as a 3,4-epoxycyclohexylmethyl (meth)acrylate/(meth)acrylic acid copolymer and a 3,4-epoxytricyclo[5.2.1.0$^{2,6}$]decyl acrylate/(meth)acrylic acid copolymer; a resin [K2] such as a glycidyl (meth)acrylate/benzyl(meth)acrylate/(meth)acrylic acid copolymer, a glycidyl(meth)acrylate/styrene/(meth)acrylic acid copolymer, a 3,4-epoxytricyclo[5.2.1.0$^{2,6}$]decyl acrylate/(meth)acrylic acid/N-cyclohexylmaleimide copolymer and a 3-methyl-3-(meth)acryloyloxymethyl oxetane/(meth)acrylic acid/styrene copolymer; a resin [K3] such as a benzyl(meth)acrylate/(meth)acrylic acid copolymer and a styrene/(meth)acrylic acid copolymer; a resin [K4] such as a resin produced by adding glycidyl (meth)acrylate to a benzyl(meth)acrylate/(meth)acrylic acid copolymer, a resin produced by adding glycidyl (meth)acrylate to a tricyclodecyl (meth)acrylate/styrene/(meth)acrylic acid copolymer, and a resin produced by adding glycidyl(meth)acrylate to a tricyclodecyl(meth)acrylate/benzyl (meth)acrylate/(meth)acrylic acid copolymer; a resin [K5] such as a resin produced by reacting a tricyclodecyl (meth)acrylate/glycidyl(meth)acrylate copolymer with (meth)acrylic acid and a resin produced by reacting a tricyclodecyl(meth)acrylate/styrene/glycidyl (meth)acrylate copolymer with (meth)acrylic acid; and a resin [K6] such as a resin produced by reacting a tricyclodecyl (meth)acrylate/glycidyl(meth)acrylate copolymer with (meth)acrylic acid to produce a resin and then reacting the resin with tetrahydrophthalic anhydride.

The weight average molecular weight of the resin (B) in terms of polystyrene content is preferably 3,000 to 100,000, more preferably 5,000 to 50,000, still more preferably 5,000 to 30,000. When the molecular weight falls within the above-mentioned range, there is a tendency that the hardness of the color filter is improved, that the residual film ratio is increased, that the solubility of an unexposed part in a developing solution becomes good and that the resolution of a colored pattern is improved.

The molecular weight distribution [weight average molecular weight (Mw)/number average molecular weight (Mn)] of the resin (B) is preferably 1.1 to 6, more preferably 1.2 to 4.

The acid value of the resin (B) is preferably 50 to 170 mg-KOH/g, more preferably 60 to 150, still more preferably 70 to 135 mg-KOH/g. The acid value is a value which is determined as an amount (mg) of potassium hydroxide required for neutralizing 1 g of the resin (B), and which can be determined by, for example, the titration with an aqueous potassium hydroxide solution.

The amount of the resin (B) is preferably 7 to 65% by mass, more preferably 13 to 60% by mass, still more preferably 17 to 55% by mass, relative to the solid content. When the amount of the resin (B) falls within the above-mentioned range, there is a tendency that the resolution of the color filter and that the residual film ratio are improved.

The polymerizable compound (C) is a compound capable of being polymerized by the action of an active radical and/or an acid generated from the polymerization initiator (D). The polymerizable compound (C) includes a compound having a polymerizable ethylenically unsaturated bond, and is preferably a (meth)acrylic acid ester compound.

The polymerizable compound (C) is preferably a polymerizable compound having three or more ethylenically unsaturated bonds. Examples of the polymerizable compound include succinic acid adducts of trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol octa(meth)acrylate, tripentaerythritol hepta (meth)acrylate, tetrapentaerythritol deca(meth)acrylate, tetrapentaerythritol nona(meth)acrylate, tris(2-(meth)acryloyloxyethyl)isocyanurate, ethylene glycol-modified pentaerythritol tetra(meth)acrylate, ethylene glycol-modified dipentaerythritol hexa(meth)acrylate, propyleneglycol-modified pentaerythritol tetra(meth)acrylate, propyleneglycol-modified dipentaerythritol hexa(meth)acrylate, caprolactone-modified pentaerythritol tetra(meth)acrylate, caprolactone-modified dipentaerythritol hexa(meth)acrylate and dipentaerythritol penta(meth)acrylate.

The weight average molecular weight of the polymerizable compound (C) is preferably 150 to 2,900, more preferably 250 to 1,500.

The amount of the polymerizable compound (C) is preferably 7 to 65% by mass, more preferably 13 to 60% by mass, still more preferably 17 to 55% by mass, relative to the solid content. When the amount of the polymerizable compound (C) falls within the above-mentioned range, there is a tendency that the residual film ratio during the molding of the color filter and that the chemical resistance of the color filter are improved.

The polymerization initiator (D) is not particularly limited, as long as the polymerization initiator (D) is a compound capable of generating active radicals, an acid or the like by the action of light or heat to initiate polymerization. Any known polymerization initiator can be used. Examples of the polymerization initiator capable of generating active radicals include an alkylphenone compound, a triazine compound, an acylphosphine oxide compound, an O-acyloxime compound and a biimidazole compound. Specific examples of these compounds include the compounds described in JP-A-2008-80068, JP-A-2011-132215, JP-A-2013-231165, International Publication No. 2008/78678, International Publication No. 2008/78686 and International Publication No. 2012/132558. For the purpose of improving sensitivity during the formation of the color filter, the polymerization initiator (D) preferably contains an O-acyloxime compound.

Further, if required, a polymerization initiation aid may be used in combination. The polymerization initiation aid is a compound to be used for accelerating polymerization of a polymerizable compound the polymerization of which has been started by the polymerization initiator or a sensitizer. Examples of the polymerization initiation aid include an amine compound, an alkoxyanthracene compound, a thioxanthone compound and a carboxylic acid compound.

The amount of the polymerization initiator (D) is preferably 0.1 to 30 parts by mass, more preferably 1 to 20 part by mass, relative to 100 parts by mass of the total amount of the resin (B) and the polymerizable compound (C). When the amount of the polymerization initiator (D) falls within the above-mentioned range, there is a tendency that the sensitivity is increased and that the time of exposure to light is shortened, resulting in the improvement in productivity of the color filter.

In the case where the polymerization initiation aid is used, the amount of the polymerization initiation aid is preferably 0.1 to 30 parts by mass, more preferably 1 to 20 parts by mass, relative to 100 parts by mass of the total amount of the resin (B) and the polymerizable compound (C). When the amount of the polymerization initiation aid falls within the above-mentioned range, there is a tendency that the color filter can be produced with higher sensitivity.

If required, the binder (W) may additionally contain an additive known in the art, such as a leveling agent, a filler, another polymeric compound, an adhesion accelerator, an antioxidant agent, a light stabilizer and a chain transfer agent.

The solvent (E) is not particularly limited, as long as the solvent (E) can dissolve the binder (W) therein. Any solvent that has been used conventionally in the art can be used. Examples of the solvent (E) include an ester solvent (a solvent that contains —COO— but does not contain —O— in the molecule), an ether solvent (a solvent that contains —O— but does not contain —COO— in the molecule), an ether ester solvent (a solvent that contains both —COO— and —O— in the molecule), a ketone solvent (a solvent that contains —CO— but does not contain —COO— in the molecule), an alcohol solvent (a solvent that contains OH but does not contain —O—, —CO— nor —COO— in the molecule), an aromatic hydrocarbon solvent, an amide solvent and dimethyl sulfoxide. Specific examples of these solvents include solvents which are described in, for example, JP-A-2013-231165.

The solvent is preferably an organic solvent having a boiling point of 120 to 180° C. inclusive at 1 atm from the viewpoint of applicability and drying performance. Preferred examples of the solvent include propylene glycol monomethylether acetate, ethyl lactate, propylene glycol monomethyl ether, ethyl 3-ethoxypropionate, ethylene glycol monomethyl ether, diethylene glycol monomethyl ether, diethylene glycol monoethyl ether, 4-hydroxy-4-methyl-2-pentanone and N,N-dimethylformamide.

The amount of the solvent (E) is preferably 70 to 95% by mass, more preferably 75 to 92% by mass, relative to the whole amount of the coloring composition (Z). In other words, the solid content in the coloring composition (Z) is preferably 5 to 30% by mass, more preferably 8 to 25% by mass. When the amount of the solvent (E) falls within the above-mentioned range, there is a tendency that the flatness during application becomes good and the color density of the color filter formed using the solvent becomes not insufficient, resulting in the achievement of good displaying properties.

<Color Filter Layer>

The liquid crystal display device according to the present invention is provided with a color filter layer. The color filter layer at least comprises a blue color filter, a green color filter and a red color filter, and may additionally have at least one color filter selected from the group consisting of a yellow color filter, a cyan color filter and a magenta color filter.

In addition, for the purpose of preventing the leakage of light from gaps between the color filters and obtaining an image having higher quality, a light-shielding pattern that is called "a black matrix" may be arranged between the color filters.

Examples of the method for producing the color filters include a photolithography method, an inkjet method and a printing method. Among these methods, a photolithography method is preferred. The photolithography method is carried out in such a manner that a coloring composition (Z) is applied on a substrate and then dried to form a coloring composition layer and then the coloring composition layer is developed by exposing the coloring composition layer to light through a photomask.

Examples of the method for forming the black matrix include: a method in which a chromium and/or chromium oxide (single or laminated) film is formed on the entire surface of a substrate by a method such as sputtering, and then only a part on which a color filter is to be formed is removed by etching; and a method in which a light-shielding pattern is formed from a photosensitive composition having a light-shielding component dispersed or dissolved therein by a photolithography method.

Examples of the substrate include: a glass plate made from, for example, quartz glass, borosilicate glass, alumina silicate glass, soda lime glass of which the surface is coated with silica, or the like; a resin plate made from, for example, polycarbonate, poly(methyl methacrylate), polyethylene terephthalate or the like; a substrate made from silicon; and a substrate produced by forming a thin film made from aluminum, silver or a silver/copper/palladium alloy or the like on a substrate.

On the substrate having the black matrix formed thereon, a color filter is produced from a coloring composition (Z) using a photolithography method or the like. This procedure is repeated using coloring compositions respectively corresponding to a red color filter, a green color filter, a blue color filter and the like, thereby producing a color filter layer.

The formation of a color filter using a photolithography method can be carried out using a known or conventional device or under known or conventional conditions. For example, a color filter can be produced in the following manner.

First, a coloring composition (Z) is applied onto a substrate, and then dried by heat-drying (prebaking) and/or drying under reduced pressure to remove volatile components including a solvent from the composition, thereby producing a smooth coloring composition layer.

As the application method, a spin coat method, a slit coat method, a slit-and-spin coat method and the like can be mentioned.

The temperature to be employed in the case where heat-drying is carried out is preferably 30 to 120° C., more preferably 50 to 110° C. The time for the heating is preferably 10 seconds to 60 minutes, more preferably 30 seconds to 30 minutes.

In the case where drying under reduced pressure is carried out, it is preferred to carry out the drying procedure under a pressure of 50 to 150 Pa and at a temperature of 20 to 25° C.

The film thickness of the coloring composition layer is not particularly limited, and may be selected appropriately depending on the desired film thickness of the color filter to be produced.

Next, the coloring composition layer is exposed to light through a photomask for forming a desired colored pattern. The pattern on the photomask is not particularly limited, and a pattern suitable for the intended use may be used.

A light source to be used for the exposure to light is preferably a light source capable of generating light having a wavelength of 250 to 450 nm. For example, light having a wavelength of shorter than 350 nm may be cut with a filter capable of cutting light having that wavelength region, or light having a wavelength of around 436 nm, around 408 nm or around 365 nm may be extracted selectively with a band-pass filter capable of extracting light having those wavelengths. Specifically, a mercury lamp, a light-emitting diode, a metal halide lamp, a halogen lamp and the like can be mentioned.

A light-exposing device such as a mask aligner and a stepper is preferably used because the device is capable of emitting a parallel light beam uniformly over the whole area of the exposed surface or aligning the photomask accurately to the substrate which has the coloring composition layer formed thereon.

A colored pattern can be formed on the substrate by bringing the exposed coloring composition layer into contact with a developing solution to develop the coloring composition layer. By developing, an unexposed area in the coloring composition layer can be dissolved in the developing solution and therefore removed. A preferred example of the developing solution is an aqueous solution of an alkaline compound such as potassium hydroxide, sodium hydrogen carbonate, sodium carbonate and tetramethylammonium hydroxide. The concentration of the alkaline compound in the aqueous solution is preferably 0.01 to 10% by mass, more preferably 0.03 to 5% by mass. The developing solution may additionally contain a surfactant.

The developing method to be employed may be any one selected from a paddle method, a dipping method, a spray method and others. During the developing process, the substrate may be inclined at any degree of angle.

After the developing process, the resultant product is preferably washed with water.

Furthermore, the resultant colored pattern is preferably subjected to post-baking. The temperature for the post-baking is preferably 150 to 250° C., more preferably 160 to 235° C. The time for the post-baking is preferably 1 to 120 minutes, more preferably 10 to 60 minutes.

In this manner, a color filter can be produced as a cured colored pattern.

In the present invention, the red color filter meets the requirement represented by formula (Q1), the green color filter meets the requirement represented by formula (Q2), and the blue color filter meets the requirement represented by formula (Q3).

$$0.1 \leq F_R \times C_R \leq 1.0 \qquad \text{Formula (Q1):}$$

[wherein $F_R$ represents the thickness (μm) of the red color filter; and $C_R$ represents the ratio of the amount of the red coloring agent to the total amount of the coloring agent ($A_R$) and the binder ($W_R$) in the red-coloring composition]

$$0.1 \leq F_G \times C_G \leq 1.2 \qquad \text{Formula (Q2):}$$

[wherein $F_G$ represents the thickness (μm) of the green color filter; and $C_G$ represents the ratio of the amount of the coloring agent ($A_G$) to the total amount of the coloring agent ($A_G$) and the binder ($W_G$) in the green-coloring composition]

$$0.1 \leq F_B \times C_B \leq 1.0 \qquad \text{Formula (Q3):}$$

[wherein $F_B$ represents the thickness (μm) of the blue color filter; and $C_B$ represents the ratio of the amount of the coloring agent ($A_B$) to the total amount of the coloring agent ($A_B$) and the binder ($W_B$) in the blue-coloring composition]

The thickness of each of the color filters can be measured with a film thickness measurement device.

In the present invention, the red color filter preferably meets the requirement represented by formula (Q1'), the green color filter preferably meets the requirement represented by formula (Q2'), and the blue color filter preferably meets the requirement represented by formula (Q3').

$$0.2 \leq F_R \times C_R \leq 0.8 \qquad (Q1')$$

$$0.3 \leq F_G \times C_G \leq 1.1 \qquad (Q2')$$

$$0.3 \leq F_B \times C_B \leq 0.9 \qquad (Q3')$$

[wherein each symbol is as defined above]

When the color filters meet the requirements represented by the above-mentioned formulae, the color reproducibility of each of the color filters becomes excellent and the durability during the production of the color filter layer and the production of a layer (e.g., an over coat layer, a transparent electrode) that is to be formed above the color filter layer also become excellent, and therefore the yield of the production of the display device can be improved.

In the present invention, the color filter layer generally contains a black matrix in addition to the above-mentioned red, green and blue color filters.

With respect to the color filter layer, the red, green and blue color filters preferably meet the requirements represented by formula (Q1), formula (Q2) and formula (Q3), respectively, and further $\sigma_F$ in formula (Q4) is preferably 0.2 or less, more preferably 0.15 or less, still more preferably 0.09 or less.

$$\sigma_F = [\{(F_R - F_A)^2/3\} + \{(F_G - F_A)^2/3\} + \{(F_B - F_A)^2/3\}]^{1/2} \qquad (Q4)$$

[in formula (Q4), $F_A$ represents an average value of any one of $F_R$, $F_G$ and $F_B$]

When $\sigma_F$ falls within the above-mentioned range, the smoothness of the color filter layer becomes excellent so that the occurrence of breakage or cracking of a transparent electrode or the disturbance of orientation of the liquid crystal is likely to be prevented, showing excellent display properties.

In the blue color filter, the ratio of the transmittance ($T_{BL}$) at $\lambda_1$ to a maximum transmittance ($T_B$) in a wavelength range from 380 to 780 nm, i.e., ($T_{BL}/T_B$), is preferably 0.85 or more, more preferably 0.89 or more, still more preferably 0.91 or more.

When $T_{BL}/T_B$ falls within the above-mentioned range, there is a tendency that a blue color filter having higher lightness can be produced.

In the green color filter, the ratio of the transmittance ($T_{GL}$) at $\lambda_2$ to a maximum transmittance ($T_G$) in a wavelength range from 380 to 780 nm, i.e., ($T_{GL}/T_G$), is preferably 0.85 or more, more preferably 0.89 or more, still more preferably 0.91 or more. When $T_{GL}/T_G$ falls within the above-mentioned range, there is a tendency that a green color filter having higher lightness can be produced.

In the red color filter, the ratio of the transmittance ($T_{RL}$) at $\lambda_3$ to a maximum transmittance ($T_R$) in a wavelength range from 380 to 780 nm, i.e., ($T_{RL}/T_R$), is preferably 0.85 or more, more preferably 0.89 or more, still more preferably 0.91 or more. When $T_{RL}/T_R$ falls within the above-mentioned range, there is a tendency that a red color filter having higher lightness can be produced.

Preferably the color filters contained in the color filter layer meet the above-mentioned requirements, since the lightness in white display of the color filter layer tends to be increased. Each of the coloring compositions which meet the above-mentioned requirements can be controlled by controlling the types or amounts of the dye and the pigment to be contained in each of the coloring agents for each of the coloring compositions.

<Light-Emitting Device (Y)>

The light-emitting device (Y) is equipped with a light source (L) and a color conversion layer (M) containing quantum dots.

The light emitted from the light-emitting device (Y) has, in its emission spectrum, a first emission peak, a second emission peak and a third emission peak, wherein the wavelength ($\lambda_1$) of the first emission peak ranges from 420 to 480 nm, the wavelength ($\lambda_2$) of the second emission peak ranges from 500 to 550 nm, and the wavelength ($\lambda_3$) of the third emission peak ranges from 580 to 650 nm.

Examples of the light source (L) include an electroluminescence, a cold cathode fluorescent lamp, a hot cathode fluorescent lamp, a light-emitting diode (LED), a laser light source and a mercury lamp. Among these light sources, a light-emitting diode (LED) is preferred.

The light source (L) is preferably one capable of emitting light which has an emission peak at a wavelength of 480 nm or shorter, more preferably one capable of emitting light which has an emission peak at a wavelength of 420 to 480 nm.

As the light source capable of emitting light which has an emission peak at a wavelength of 420 to 480 nm, a blue LED and the like can be mentioned. As the light source capable of emitting light which has an emission peak at a wavelength of shorter than 420 nm, an ultraviolet ray laser and the like can be mentioned.

The color conversion layer (M) generally comprises a substrate and quantum dots that serve as a color-converting substance.

The wavelength of incident light can be converted by the action of the quantum dots that are contained as a color-converting substance in the color conversion layer (M).

The color conversion layer (M) is preferably a layer which converts light having an emission peak at $\lambda_1$ into light having an emission peak at $\lambda_2$ or light having an emission peak at $\lambda_3$.

The color conversion layer (M) preferably contains a substance capable of converting light having an emission peak at $\lambda_1$ into light having an emission peak at $\lambda_2$ (wherein the substance is sometimes referred to as "substance 2", hereinbelow) and a substance capable of converting light having an emission peak at $\lambda_1$ into light having an emission peak at $\lambda_3$ (wherein the substance is sometimes referred to as "substance 3", hereinbelow) therein. The ratio of the mass of the substance 2 to the mass of the substance 3 to be contained in the color conversion layer (M) is preferably 9:1 to 2:1.

In the case where both of the substances are contained in the layer, light that is emitted from the light source (L) and passes through the color conversion layer (M) contains two types of light of which the wavelengths are converted by the color-converting substances, i.e., light having an emission peak at $\lambda_2$ and light having an emission peak at $\lambda_3$. In addition, light having an emission peak at $\lambda_1$ which has not been converted by the color-converting substances is also contained.

In the case where the light source (L) is one capable of emitting light which has an emission peak at a wavelength of shorter than 420 nm, the color conversion layer (M) preferably contains a substance capable of converting light emitted from the light source (L) (which light is referred to as "emitted light", hereinbelow) into light having an emission peak at $\lambda_1$, and a substance capable of converting the emitted light into light having an emission peak at $\lambda_2$ and a substance capable of converting the emitted light into light having an emission peak at $\lambda_3$. In the case where these substances are contained in the layer, light that is emitted from the light source (L) and passes through the color conversion layer (M) contains three types of light of which the wavelengths are converted by the color-converting substances, i.e., light having an emission peak at $\lambda_1$, light having an emission peak at $\lambda_2$, and light having an emission peak at $\lambda_3$.

The color conversion layer (M) contains, in the substrate thereof, a color-converting substance capable of converting into lights having a specific wavelength so that the layer can emit various types of light having various wavelengths by selecting the types of the color-converting substance appropriately. The color conversion layer (M) has at least one layer which contains one or more color-converting substance. In the color conversion layer (M), one single layer may contain several types of color-converting substances, or each of different layers may contain one or more types of color-converting substances. White light from the light source can be emitted by mixing light emitted from the light source with light of which the wavelength is converted by the color-converting substance.

The color-converting substances to be contained in the color conversion layer (M) are mixed with the substrate uniformly. The color-converting substances to be contained may be dissolved in the substrate completely, or dispersed in particulate forms in the substrate uniformly. In the case where color-converting substances in particulate forms are dispersed in the substrate, light emitted from the light source toward the outside can be converted into light having a desired wavelength and the light can be scattered by the particles, so that the direction dependency can be controlled as to the intensity of the emitted light.

Examples of the substrate include: an organic solvent; a glass such as a resin glass, a mold glass, an acryl glass and a crystal glass; a thermoplastic resin such as an acrylic resin and an ABS (acrylonitrile-butadiene-styrene) resin; a heat-curable resin such as an epoxy resin; and a photosensitive resin.

The amount of the quantum dots in the color conversion layer (M) is generally 0.01 to 50% by mass, preferably 0.1 to 20% by mass.

Preferably, the color conversion layer (M) has a film-like molded form when the substrate has a solid form and it has a form filled in a tubular container made from glass or the like (i.e., a capillary) when the substrate has a liquid form.

In the case where the substrate has a solid form, because of ease of molding into a film-like form, the substrate is preferably a resin, more preferably a heat-curable resin or a photosensitive resin as mentioned above.

Examples of the method for molding the substrate into a film-like form include extrusion molding, molding using a cast method.

In the case where the substrate is a heat-curable resin or a photosensitive resin, the substrate can also be produced by applying a composition containing the substrate and the quantum dots onto a substrate and then curing the composition by applying heat, by irradiating with light, or the like.

The color-converting substances are preferably dispersed in the substrate uniformly. The color-converting substances may be dispersed only in the substrate in order not to disturb the interface of the color conversion layer (M), or may be dispersed so that the color-converting substances are protruded from the interface to form an irregular structure on the interface.

Preferably an irregular structure is formed on the interface of the color conversion layer (M), since the refractive index of light can be controlled and the overall refractive index control performance can be improved.

The color conversion layer (M) contains quantum dots as a color-converting substance.

The quantum dots are semiconductor microparticles each having a longer diameter of about 1 to 100 nm, and can absorb ultraviolet light or visible light to emit light by the use of band gaps in the semiconductor.

Examples of the quantum dots include: a compound of an Group-12 element with a Group-16 element, such as CdS, CdSe, CdTe, ZnS, ZnSe, ZnTe, HgS, HgSe, HgTe, CdHgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe;

a compound of a Group-13 element with a Group-15 element, such as GaN, GaP, GaAs, AlN, Alp, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs and InAlPAs; and a compound of a Group-14 element with a Group-16 element, such as PdS and PbSe.

In the case where the quantum dots contain S or Se, the surfaces of the microparticles to be used may be modified with a metal oxide or an organic substance for the purpose of preventing the drawing out of S or Se by a reactive component which is in the substrate constituting the color conversion layer (M).

Alternatively, two or more of the above-mentioned compounds may be combined to form a core-shell structure. As an example of the combination, microparticles in each of which the core is made from CdSe and the shell is made from ZnS can be mentioned.

Because the energy state of the quantum dots depends on the sizes of the quantum dots, the wavelength of emitted light can be selected freely by varying the particle diameters of the quantum dots. For example, in the case where the quantum dots are made from only CdSe, quantum dots having particle diameters of 2.3 nm, 3.0 nm, 3.8 nm or 4.6 nm can emit light having a fluorescence spectrum having a peak wavelength of 528 nm, 570 nm, 592 nm or 637 nm, respectively. The light emitted from the quantum dots has a narrow spectrum width. By combining different types of light having sharp peaks as mentioned above, the color range which the liquid crystal display device can display becomes expanded.

Furthermore, the quantum dots have high response to ultraviolet light or visible light so that light emitted from the light source can be utilized with high efficiency.

In the light emitted from the light-emitting device (Y), the half width of the first emission peak is preferably 30 nm or less, more preferably 25 nm or less.

The half width of the second emission peak is preferably 70 nm or less, more preferably 60 nm or less, still more preferably 45 nm or less.

The half width of the third emission peak is preferably 70 nm or less, more preferably 60 nm or less, still more preferably 45 nm or less.

The light-emitting device in the present invention is described with reference to examples shown in FIGS. 1 and 2.

Figure 2:
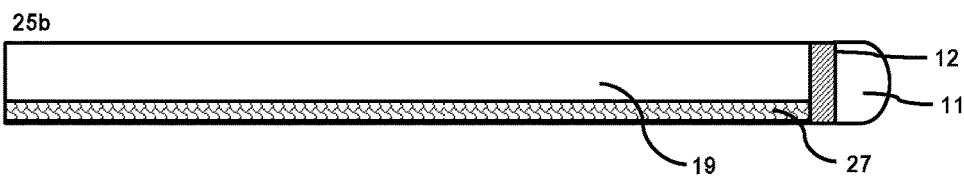
FIG. 2 illustrates one example of a light-emitting device to be used in the liquid crystal display device according to the present invention.

Each of the light-emitting devices shown in FIGS. 1 and 2 comprises a light source 11, a color conversion layer 12, a light guide 19, a reflection plate 27, a diffusion sheet (not shown in the drawings) and a field-of-view angle control sheet (not shown in the drawings).

In the light-emitting device 25a shown in FIG. 1, light emitted from the light source 11 enters the light guide 19, and then it is changed in its course by the reflection plate 27, followed by being diffused by the diffusion sheet. The diffused light is controlled so as to have a desired orientation by the field-of-view angle control sheet, and then passes through the color conversion layer 12 and is emitted from the light-emitting device 25a.

As the color conversion layer 12 in the light-emitting device 25a, a color conversion layer (M) formed in a film-like shape is preferred.

The light guide 19 mainly comprises a transparent thermoplastic resin such as a polycarbonate resin and an acrylic resin, and is provided with a strip-shaped fine irregular pattern formed on the color conversion layer 12-side surface thereof for the purpose of improving the straight travelling properties of the light that transmits into the light guide 19.

The reflection plate 27-side surface of the light guide 19 has been treated so as to scatter the light that propagates in the light guide 19. Examples of the treatment include a treatment for printing a scattering agent in a pattern-like form, a treatment for providing parts each containing a filler, and a treatment for partially roughening the surface.

The reflection plate 27 is composed of expanded PET (polyethylene terephthalate), a silver-deposited film, a multilayered reflection film, white PET or the like. In the case where it is intended to impart a regular reflection (specular reflection) function to the reflection plate 27, the surface is preferably subjected to silver deposition or aluminum deposition or a treatment such as multilayered film reflection. In the case where the reflection plate 27 has a fine surface structure, the fine surface structure is formed integrally by using a method of heat press molding or melt extrusion molding or the like using a thermoplastic resin.

As the thermoplastic resin, a polycarbonate; an acrylic resin such as polymethyl methacrylate; a polyester resin such as PET; an amorphous co-polyester resin such as a copolymer of methyl methacrylate and styrene; a polystyrene resin or a polyvinyl chloride resin can be used. The fine surface structure may be formed by applying a photosensitive resin and the like onto a substrate made from PET or a glass and then irradiating the photosensitive resin with ultraviolet ray or the like to transcribe a pattern to the resultant product.

In the light-emitting device 25b shown in FIG. 2, light emitted from the light source 11 passes through the color conversion layer 12, enters the light guide 19 and then is changed in its course by the reflection plate 27, followed by being diffused in the diffusion sheet. The diffused light is controlled so as to have a desired orientation by the field-of-view angle control sheet, and then is emitted from the light-emitting device 25b.

The light guide 19 and the reflection plate 27 in the light-emitting device 25b can be formed in the same manner as mentioned above.

The color conversion layer 12 in the light-emitting device 25b is preferably a color conversion layer (M) that is molded in a film-like shape or a color conversion layer (M) that is filled in a tubular container.

<Liquid Crystal Display Device According to the Present Invention>

The liquid crystal display device according to the present invention is equipped with the above-mentioned color filter layer and the above-mentioned light-emitting device.

In the liquid crystal display device according to the present invention, the color filter layer generally forms a laminate together with a transparent electrode, a liquid crystal layer, a pixel electrode, a substrate, an alignment film, a thin film transistor, an interlayer insulating layer and a polarizing plate. The laminate is so configured that light emitted from the above-mentioned light-emitting device can pass through the laminate.

The laminate can be produced using anyone of the methods described in "Glossary for Liquid Crystal Display Production Device, the third edition", p.p. 5-22 and the like. The liquid crystal display device can be produced using any one of the methods described in "Glossary for Liquid Crystal Display Production Device, the third edition", p.p. 23-29 and the like.

Figure 3:
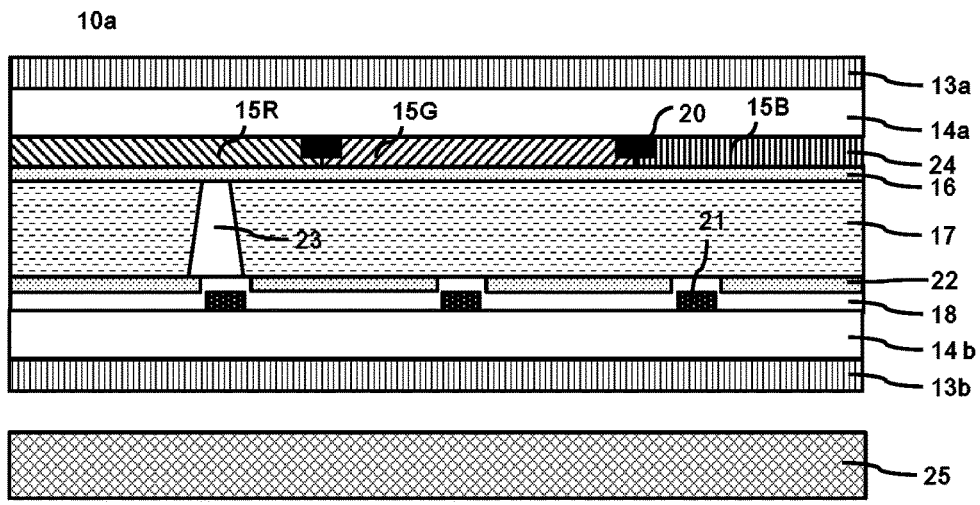
FIG. 3 illustrates one example of the liquid crystal display device according to the present invention.

One example of the liquid crystal display device according to the present invention is described with reference to the liquid crystal display device 10a shown in FIG. 3.

A color filter layer 24 is arranged at the liquid crystal layer 17 side on a substrate 14a. The color filter layer 24 is composed of a red color filter 15R, a green color filter 15G and a blue color filter 15B (which are sometimes collectively referred to as "color filters 15"), and a black matrix 20. The color filters 15 in the color filter layer 24 are respectively arranged at positions opposed to pixel electrodes 22 with a liquid crystal layer 17 interposed therebetween, and the black matrix 20 is arranged at a position opposed to the interface with the pixel electrodes. A transparent electrode 16 is arranged on the liquid crystal layer 17 side so as to cover the color filter 15 and the black matrix 20. An over coat layer (not shown in the drawing) may be arranged between the color filter layer 24 and the transparent electrode 16.

Thin film transistors 21 and the pixel electrodes 22 are arranged regularly at the liquid crystal layer 17 side on the substrate 14b. The pixel electrodes 22 are arranged at positions opposed to the color filter 15 with the liquid crystal layer 17 interposed therebetween. An interlayer insulator 18 having a connection hole (not shown in the drawing) formed therein is arranged between the thin film transistors 21 and the pixel electrodes 22.

Examples of the substrate 14 and the substrate 14b include: a glass-type substrate such as quartz glass, borosilicate glass, alumina silicate glass, and soda lime glass of which the surface is coated with silica; and a resin-type substrate such as polycarbonate, poly(methyl methacrylate) and polyethylene terephthalate. The substrate may be selected depending on the temperature required in the step of forming the color filter 15, the thin film transistor 21 and the like on the substrate. In the case where a step of heating to a high temperature is required, a glass-type substrate is preferred.

Examples of the thin film transistor 21 include a high-temperature polysilicon transistor, a low-temperature polysilicon transistor and an amorphous silicon transistor. In order to further reduce the size of the liquid crystal display device according to the present invention, a driver IC may be formed on the substrate 14b.

A liquid crystal layer 17 is arranged between the transparent electrode 16 and the pixel electrodes 22. A spacer 23 is provided in the liquid crystal layer 17 in order to keep the distance between the substrate 14a and the substrate 14b constant. In FIG. 3, although a columnar spacer is illustrated, the shape of the spacer is not limited to a columnar shape, and may have any form as long as the spacer can keep the distance between the substrate 14a and the substrate 14b constant.

The members are laminated in the following order: the substrate 14a, the color filter layer 24, the transparent electrode 16, the alignment film (not shown in the drawing), the liquid crystal layer 17, the alignment film (not shown in the drawing), the pixel electrode 22, the interlayer insulator 18, the thin film transistor 21, and the substrate 14b.

Polarizing plates 13a and 13b are respectively provided on the outer side of the substrate 14a and the outer side of the substrate 14b with the liquid crystal layer 17 interposed therebetween.

The light-emitting device 25 is arranged on the outer side of the polarizing plate 13b.

In the case wherein the liquid crystal display device according to the present invention 10a is a transmissive liquid crystal display device, light emitted from the light-emitting device 25 enters the polarizing plate 13b.

Among the incident light that is non-polarized light, only certain one-direction linearly polarized light can penetrate through the polarizing plate 13b in the liquid crystal panel. The linearly polarized light passes through the substrate 14b, the pixel electrodes 22 and the like in turn and finally reaches the liquid crystal layer 17.

The state of orientation of liquid crystal molecules contained in the liquid crystal layer 17 varies depending on the presence or absence of a difference in potential between the pixel electrodes 22 and the transparent electrode 16 that is opposed to the pixel electrodes 22, thereby controlling the luminance of light emitted from the liquid crystal display device according to the present invention 10. In the case wherein the liquid crystal layer 17 has such an orientation state that polarized light is allowed to pass therethrough without any modification, light that passes through the liquid crystal layer 17, the transparent electrode 16 and the color filter 15 is absorbed by the polarizing plate 13a. As a result, the pixels display a black color.

On the contrary, in the case where the liquid crystal layer 17 has such an orientation state that polarized light can be converted and is allowed to pass therethrough, the polarized light passes through the liquid crystal layer 17 and the transparent electrode 16, only light having a specific wavelength passes through the color filter 15 and reaches the polarizing plate 13a. As a result, the liquid crystal display device displays a color defined by the color filter most brightly. In the case where the liquid crystal layer 17 has an intermediate orientation state between the above-mentioned two orientation states, the luminance of light emitted from the liquid crystal display device 10 according to the present invention becomes intermediate between the above-mentioned two types of light. As a result, the pixels display an intermediate color.

Figure 4:
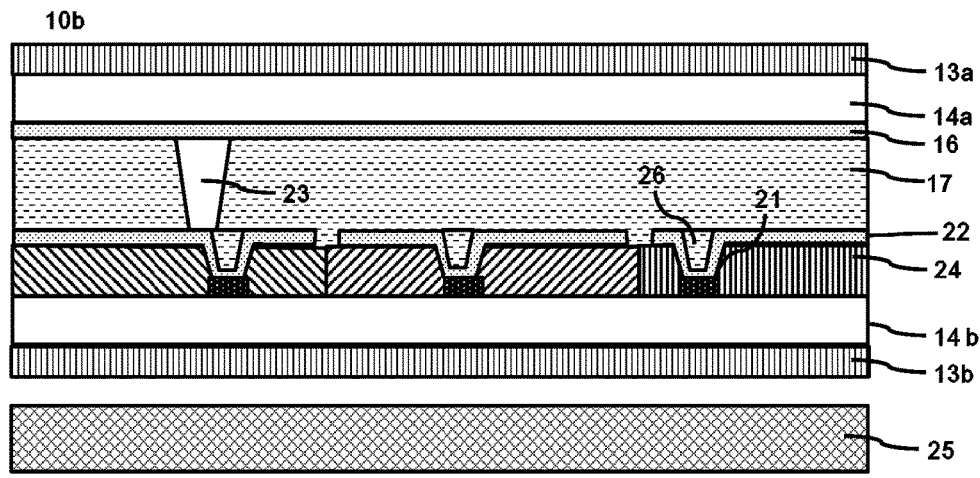
FIG. 4 illustrates one example of the liquid crystal display device according to the present invention.

One example of the liquid crystal display device according to the present invention is described with reference to the liquid crystal display device 10b shown in FIG. 4.

A thin film transistor 21, a color filter layer 24 and pixel electrodes 22 are arranged regularly at the liquid crystal layer 17 side on the substrate 14b. These members are arranged in such a manner that the pixel electrodes 22 and the thin film transistor 21 can contact with each other at a connection hole 26 in the color filter layer 24. Between the color filter layer 24 and the pixel electrodes 22, an interlayer insulator (not shown in the drawing) having a connection hole 26 may be arranged.

A transparent electrode 16 is arranged at the liquid crystal layer 17 side on the substrate 14a.

A liquid crystal layer 17 is arranged between the transparent electrode 16 and the pixel electrodes 22. A spacer 23 is arranged in the liquid crystal layer 17 in order to keep the distance between the substrate 14a and the substrate 14b constant.

The members are laminated in the following order: the substrate 14a, the transparent electrode 16, the alignment film (not shown in the drawing), the liquid crystal layer 17, the alignment film (not shown in the drawing), the pixel electrodes 22, the color filter layer 24, the protective film (not shown in the drawing), the thin film transistor 21, and the substrate 14b.

Polarizing plates 13a and 13b are respectively provided on the outer side of the substrate 14a and the outer side of the substrate 14b which are arranged with the liquid crystal layer 17 interposed therebetween.

A light-emitting device 25 is arranged on the outer side of the polarizing plate 13b.

EXAMPLES

Hereinbelow, the colored curable resin composition of the present invention will be described in more detail by way of examples. In the following examples, "%" and "part" mean "% by mass" and "part by mass", respectively, unless otherwise specified.

In the following synthesis examples, the compounds were identified by mass spectrometry (LC; model 1200, manufactured by Agilent, MASS; model LC/MSD, manufactured by Agilent), elemental analysis (VARIO-EL; (manufactured by Elementar)) or NMR (JNM-EX-270; (manufactured by JEOL Ltd.)).

Synthesis Example 1

Fifty (50) parts of a compound represented by formula (III) and 350 parts of isopropyl alcohol (manufactured by Wako Pure Chemical Industries, Ltd.) were mixed together at room temperature, then 18.1 parts of diethylamine (manufactured by Tokyo Chemical Industry Co., Ltd.) were added dropwise to the mixture at a temperature equal to or lower than 20° C., and then the resultant mixture was stirred at 20° C. for 3 hours. The reaction solution was introduced into 2100 parts of 10% hydrochloric acid. The resultant precipitates were obtained as a suction filtration residue, then washed with 373 parts of ion-exchanged water and then dried, thereby producing 23.6 parts of a compound represented by formula (Cl-22). The yield was 43%.

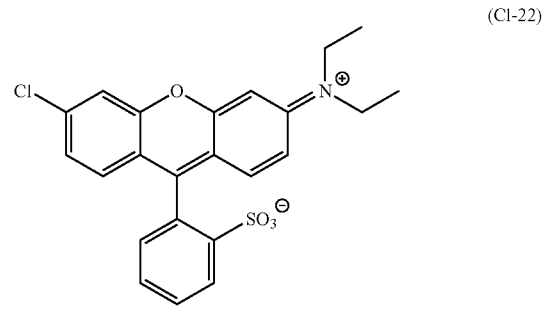

(Cl-22)

Identification of Compound Represented by Formula (Cl-22)

(Mass spectrometry) ionization mode=ESI+: m/z=[M+H]+442.1

Exact Mass: 441.1

Five (5) parts of the compound represented by formula (Cl-22) and 35 parts of N-methylpyrrolidone (manufactured by Wako Pure Chemical Industries, Ltd.) were mixed together at room temperature, then 3.4 parts of dipropylamine (manufactured by Tokyo Chemical Industry Co., Ltd.) was added dropwise to the mixture at a temperature equal to or lower than 20° C., then the resultant mixture was heated to 80° C. and then stirred at that temperature for 3 hours. The reaction solution was cooled to room temperature, and then 3.4 parts of concentrated hydrochloric acid was added to the solution, and the resultant mixture was introduced into 315 parts of saturated aqueous sodium chloride solution. The resultant precipitates were obtained as a suction filtration residue, then washed with 630 parts of ion-exchanged water, and then dried, thereby producing 3.9 parts of a compound represented by formula (I-7) (dye K1). The yield was 69%.

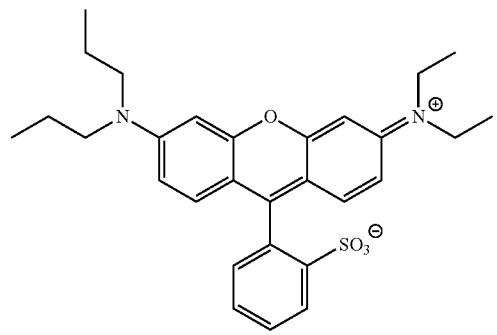

(I-7)

Identification of compound represented by formula (I-7)

(Mass spectrometry) ionization mode=ESI+: m/z=[M+H]+507.7

Exact Mass: 506.7

Synthesis Example 2

275 parts of Resorcinol (manufactured by Tokyo Chemical Industry Co., Ltd.) and 101 parts of n-hexylamine (manufactured by Tokyo Chemical Industry Co., Ltd.) were mixed together, and then the mixture was stirred at 150 to 155° C. for 20 hours while removing generated water. After the mixture was allowed to cool, the reaction mixture was dissolved in 433 parts of toluene, and the resultant toluene solution was washed with 1000 parts of water at 40° C. three times. Fifty (50) parts of anhydrous magnesium sulfate was added to the toluene solution, then the resultant solution was stirred and then filtrated. The solvent was distilled away from the filtrate to produce a crude product. The crude product was dissolved in 234 parts of toluene and then stirred at a temperature equal to or lower than 0° C., and a crystallized product was collected by filtration. The crystallized product was dried under reduced pressure at 50° C. to produce 95.7 parts of a compound represented by formula (pt1).

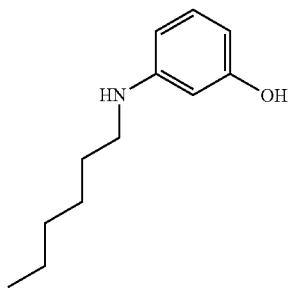

(pt1)

<Identification of Compound Represented by Formula (pt1)>

(Mass spectrometry) ionization mode=ESI+: m/z=[M+H]⁺ 194.2

Exact Mass: 193.2

95.3 parts of the compound represented by formula (pt1) and 48 parts of water were mixed together, and the mixture was stirred at 80° C. Subsequently, the resultant mixture was stirred at 80° C. for 3 hours while adding 107 parts of 1-bromo-2-ethylhexane (manufactured by Tokyo Chemical Industry Co., Ltd.) thereto, and then 22.4 parts of an aqueous 48% sodium hydroxide solution was added to the solution. The mixture was stirred at 110° C. for 18 hours. After the solution was allowed to cool, the reaction mixture was adjusted to pH 5 with an aqueous 10% sodium hydroxide solution, then 130 parts of toluene was added thereto, then the resultant solution was stirred, and then a toluene layer was extracted from the solution. The toluene extract was washed with 500 parts of warm water twice, 25 parts of anhydrous magnesium sulfate was added thereto, and then the solution was stirred and then filtrated. The solvent was distilled away from the filtrate to produce 154 parts of a residue that contained a compound represented by formula (pt2) as the main component.

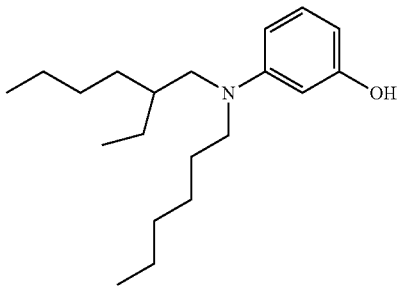

(pt2)

<Identification of Compound Represented by Formula (pt2)>

(Mass spectrometry) ionization mode=ESI+: m/z=[M+H]⁺ 306.3

Exact Mass: 305.3

154 parts of the residue that contained the compound represented by (pt2) as the main component was mixed with 597 parts of N,N-dimethylformamide, and the mixture was stirred at −6° C. to 3° C. 258 parts of phosphoryl chloride (manufactured by Wako Pure Chemical Industries, Ltd.) was added to the mixture while keeping the temperature of the solution at −6° C. to 3° C. The mixture was stirred at room temperature for 1 hour, and then stirred at 60° C. for 4 hours. After the solution was allowed to cool, the reaction mixture was added to 1500 parts of ice and then neutralized with an aqueous 48% sodium hydroxide solution. 867 parts of toluene was added to the solution to extract a toluene layer. The toluene extract was washed with 1200 parts of an aqueous 15% sodium chloride solution twice. Sixty (60) parts of anhydrous magnesium sulfate was added to the toluene extract, and the resultant mixture was stirred and then filtrated. The solvent was distilled away from the filtrate to produce a residue. The residue was purified by column chromatography to produce 94.4 parts of a compound represented by formula (pt3).

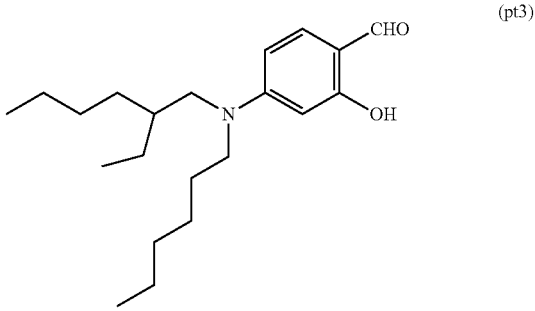 [SMILES: CCCCCCN(CC(CC)CCCC)c1ccc(C=O)c(O)c1]

(pt3)

<Identification of Compound Represented by Formula (pt3)>

(Mass spectrometry) ionization mode=ESI+: m/z=[M+H]⁺ 334.3

Exact Mass: 333.3

10.6 parts of bis(3-amino-4-hydroxyphenyl)sulfone (manufactured by Tokyo Chemical Industry Co., Ltd.), 25.3 parts of the compound represented by formula (pt3), 3.20 parts of benzoic acid (manufactured by Tokyo Chemical Industry Co., Ltd.), 184 parts of 1-pentanol (manufactured by Tokyo Chemical Industry Co., Ltd.) and 8.59 parts of ethyl cyanoacetate (manufactured by Tokyo Chemical Industry Co., Ltd.) were mixed together, and the mixture was stirred at 120° C. for 3 hours. The reaction solution were mixed with 25.4 parts of the compound represented by formula (pt3), 3.21 parts of benzoic acid (manufactured by Tokyo Chemical Industry Co., Ltd.), 90 parts of 1-pentanol (manufactured by Tokyo Chemical Industry Co., Ltd.) and 8.59 parts of ethyl cyanoacetate (manufactured by Tokyo Chemical Industry Co., Ltd.). The mixture was stirred at 120° C. for 12 hours. The reaction solution was cooled to room temperature and then added to 1800 parts of methanol, and the precipitated crystals were obtained as a suction filtration residue. The residue was purified by column chromatography to produce 20.6 parts of a compound represented by formula (Ad2-10). The structure of the compound was confirmed by $^1$H-NMR.

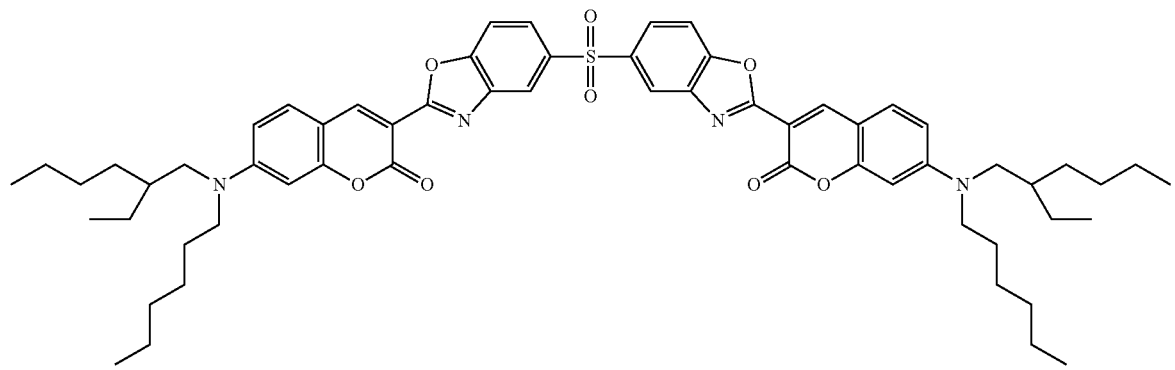 [SMILES: CCCCCCN(CC(CC)CCCC)c1ccc2cc(-c3nc4cc(S(=O)(=O)c5ccc6oc(-c7cc8ccc(N(CCCCCC)CC(CC)CCCC)cc8oc7=O)nc6c5)ccc4o3)c(=O)oc2c1]

<Identification of Compound Represented by Formula (Ad2-10)>

$^1$H-NMR (500 MHz, DMSO-d$_6$): 0.85 (6H, t), 0.87 (6H, t), 0.87 (6H, t), 1.20 to 1.40 (28H), 1.56 (4H, tt), 1.75 (2H, ttt), 3.34 (4H, d), 3.43 (4H, t), 6.55 (2H, d), 6.79 (2H, dd), 7.64 (2H, d), 7.91 (2H, d), 8.01 (2H, dd), 8.36 (2H, d), 8.73 (2H, s)

Synthesis Example 3

The following reaction was carried out under a nitrogen atmosphere. Into a flask equipped with a cooling tube and a stirrer, 32.2 parts of potassium thiocyanate and 160 parts of acetone were introduced. The resultant mixture was stirred at room temperature for 30 minutes. Subsequently, 50 parts of 2-fluorobenzoic acid chloride (manufactured by Tokyo Chemical Industry Co., Ltd.) was added dropwise to the mixture over 10 minutes. After the completion of the dropwise addition, the solution was further stirred at room temperature for 2 hours. Subsequently, the reaction mass was ice-cooled, and then 40.5 parts of N-ethyl-o-toluidine (manufactured by Tokyo Chemical Industry Co., Ltd.) was added dropwise thereto. After the completion of the dropwise addition, the solution was further stirred at room temperature for 30 minutes. Subsequently, the reaction mass was ice-cooled, and then 34.2 parts of an aqueous 30% sodium hydroxide solution was added dropwise thereto. After the completion of the dropwise addition, the solution was further stirred at room temperature for 30 minutes. Subsequently, 31.3 parts of chloroacetic acid was added dropwise to the solution at room temperature. After the completion of the dropwise addition, the solution was stirred for 7 hours while heating under reflux. Subsequently, the reaction mass was allowed to cool to room temperature, then reaction solution was poured into 120 parts of tap water, then 200 parts of toluene was added to the solution, and then the solution was stirred for 30 minutes. Subsequently, the stirring was terminated and the solution was allowed to stand for 30 minutes. As a result, the solution was separated into an organic layer and an aqueous layer. The aqueous layer was discarded by a liquid separation procedure, the organic layer was washed with 200 parts of 1 N hydrochloric acid, then washed with 200 parts of tap water, and finally washed with 200 parts of saturated aqueous sodium chloride solution. A proper amount of sodium sulfate was added to the organic layer, and the mixture was stirred for 30 minutes and then filtrated to produce an organic layer from which water was removed. The solvent was distilled away from the resultant organic layer using an evaporator to produce a pale yellow liquid. The pale yellow liquid was purified by column chromatography. The purified pale yellow liquid was dried under reduced pressure at 60° C. to produce 49.9 parts of a compound represented by formula (B-I-7). The yield: 51%.

(B-I-7)

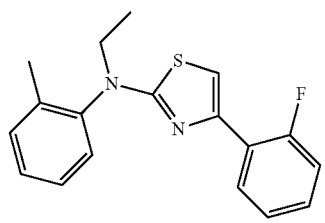

The following reaction was carried out under a nitrogen atmosphere. Into a flask equipped with a cooling tube and a stirrer were introduced 15.3 parts of N-methylaniline (manufactured by Tokyo Chemical Industry Co., Ltd.) and 60 parts of N,N-dimethylformamide. The mixed solution was ice-cooled. 5.7 parts of 60% Sodium hydride (manufactured by Tokyo Chemical Industry Co., Ltd.) was added in portions to the mixed solution over 30 minutes under ice-cooling, and then the solution was stirred for 1 hour while heating to room temperature. The reaction solution was added in portions to 200 parts of ice water, the mixed solution was allowed to stand at room temperature for 15 hours, and water was removed from the solution by decantation to produce a viscous solid as a residue. Sixty (60) parts of methanol was added to the viscous solid and then stirred at room temperature for 15 hours. The precipitated solid was filtrated off and then purified by column chromatography. The purified pale yellow solid was dried under reduced pressure at 60° C. to produce 9.8 parts of a compound represented by formula (BP3). The yield: 53%.

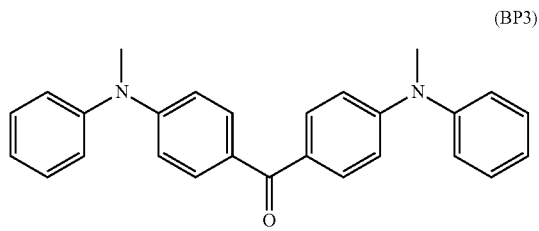 [SMILES: CN(c1ccccc1)c1ccc(C(=O)c2ccc(N(C)c3ccccc3)cc2)cc1]

(BP3)

The following reaction was carried out under a nitrogen atmosphere. Into a flask equipped with a cooling tube and a stirrer, there were introduced 8.2 parts of the compound represented by formula (B-I-7), 10.0 parts of the compound represented by formula (BP3) and 20 parts of toluene. Subsequently, 12.2 parts of phosphorus oxychloride was added to the solution, and the mixed solution was stirred at 95 to 100° C. for 3 hours. Subsequently, the reaction mixture was cooled to room temperature, and then diluted with 170.0 parts of isopropanol. Subsequently, the diluted reaction solution was poured into 300 parts of saturated aqueous sodium chloride solution, then 100 parts of toluene was added to the solution, and then the mixed solution was stirred for 30 minutes. Subsequently, the stirring was terminated, and then the solution was allowed to stand for 30 minutes. As a result, the solution was separated into an organic layer and an aqueous layer. The aqueous layer was discarded by a liquid separation procedure, and then the organic layer was washed with 300 parts of saturated aqueous sodium chloride solution. A proper amount of sodium sulfate was added to the organic layer, and then the solution was stirred for 30 minutes and then filtrated to produce an organic layer from which water was removed. The solvent was distilled away from the resultant organic layer with an evaporator to produce a bluish-purple solid. The bluish-purple solid was dried under reduced pressure at 60° C. to produce 18.4 parts of a compound represented by formula (A-II-18). The yield: 100%.

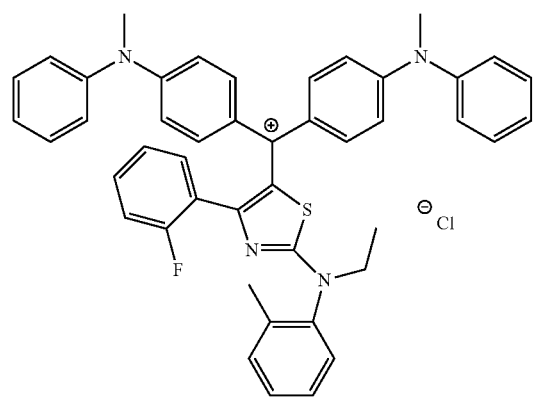

(A-II-18)

Identification of Compound Represented by Formula (A-II-18)

(Mass spectrometry) ionization mode=ESI+: m/z=687.3 [M-Cl]$^+$

Exact Mass: 722.3

The following reaction was carried out under a nitrogen atmosphere. Into a flask equipped with a cooling tube and a stirrer there were introduced 10.0 parts of the compound represented by formula (A-II-18), 5.9 parts of bis(trifluoromethanesulfonyl)imide lithium (manufactured by Tokyo Chemical Industry Co., Ltd.) and 100.0 parts of N,N-dimethylformamide. The mixed solution was stirred at 50 to 60° C. for 3 hours. Subsequently, the reaction mixture was cooled to room temperature, and then was added dropwise to 2000 parts of tap water while stirring for 1 hour to produce a dark blue suspension. The resultant suspension was filtrated to produce a bluish green solid. The bluish green solid was dried under reduced pressure at 60° C. to produce 13.2 parts of a compound represented by formula (Ab2-1). The yield: 86%.

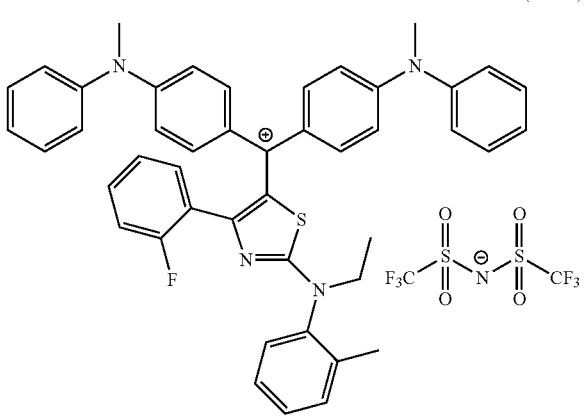

(Ab2-1)

0.35 g of the compound represented by formula (Ab2-1) was dissolved in chloroform to make up to the volume of 250 cm$^3$, a portion (2 cm$^3$) of the solution was diluted with ion-exchanged water to make up to the volume of 100 cm$^3$ (concentration: 0.028 g/L), and the diluted solution was subjected to the measurement of an absorption spectrum with a spectrophotometer (a quartz cell, optical path length; 1 cm). The compound showed an absorbance of 2.8 (arbitrary unit) at a maximum absorption wavelength λmax=620 nm.

Synthesis Example 4

There were mixed 10.0 parts of 2,4-Dimethylaniline (manufactured by Tokyo Chemical Industry Co., Ltd.), 17.0 parts of 2-ethylhexane bromide (manufactured by Tokyo Chemical Industry Co., Ltd.), 44.0 parts of tetrabutylammonium bromide (manufactured by Wako Kagaku Kogyo K. K.) together. The resultant mixture was stirred at 90° C. for 8 hours. After the completion of the reaction, 50 parts of a 10% aqueous sodium bicarbonate solution was added to the solution, then 100 parts of ethyl acetate was added thereto, and then an aqueous layer was discarded. A washing procedure with water and then with 10% hydrochloric acid was repeated twice, and then the solvent was distilled away from the solution. The resultant oil was dried under reduced pressure at 60° C. for 24 hours to produce 9.3 parts of a compound represented by formula (d-1).

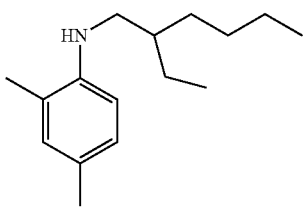

(d-1)

The $^1$H-NMR data (270 MHz, δ value (ppm, relative to TMS), DMSO-d6) δ for the compound represented by formula (d-1): 0.85 (m, 6H), 1.23-1.42 (br, 8H), 1.59 (br, 1H), 2.04 (s, 3H), 2.12 (s, 3H), 2.91 (d, 2H), 4.37 (br, 1H), 6.38 (d, 1H), 6.75 (s, 1H), 6.77 (d, 1H)

Three (3.0) parts of the above-produced compound represented by formula (d-1), 2.2 parts of 3-bromophenol (manufactured by Tokyo Chemical Industry Co., Ltd.), 0.015 parts of palladium acetate, 3.2 parts of tert-butoxysodium (manufactured by Tokyo Chemical Industry Co., Ltd.), 0.055 parts of tri-tert-butylphosphine (manufactured by Tokyo Chemical Industry Co., Ltd.) and 25.6 parts of toluene were mixed together and then stirred at 100° C. for 15 hours. Thirty (30) parts of ethyl acetate and 100 parts of water were added to the mixture, and then an aqueous layer was discarded. A washing procedure with water was repeated twice, and the solvent was distilled away from the solution. The residue was purified by silica gel chromatography (chloroform/hexane=1/1), and the resultant oil was dried under reduced pressure at 60° C. for 24 hours to produce 1.9 parts of a compound represented by formula (d-2).

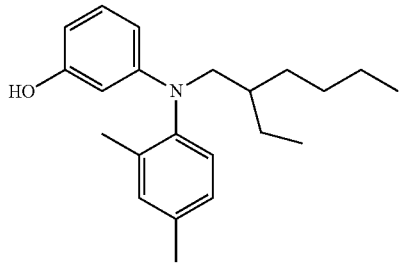

(d-2)

The $^1$H-NMR data (270 MHz, δ value (ppm, relative to TMS), DMSO-d6) for the compound represented by formula (d-2): 0.85 (m, 6H), 1.23-1.42 (br, 8H), 1.55 (br, 1H), 1.94 (s, 3H), 2.27 (s, 3H), 2.90 (d, 2H), 6.37 (d, 1H), 6.75 (s, 1H), 6.76 (d, 1H), 6.92-7.14 (m, 4H), 8.93 (s, 1H)

There were mixed 4.4 parts of the above-produced compound represented by formula (d-2), 0.8 parts of 3,4-dihydroxycyclobut-3-ene-1,2-dione (manufactured by Tokyo Chemical Industry Co., Ltd.), 90.0 parts of 1-butanol and 60.0 parts of toluene together. The resultant mixture was stirred at 125° C. for 3 hours while removing the generated water with a Dean-Stark tube. After the completion of the reaction, the solvent was distilled away from the solution, then 15 parts of acetic acid was added to the solution, then the solution was added dropwise to 100 parts of 18% aqueous sodium chloride solution, and the precipitated solid was collected by filtration. The solid that was collected by filtration was washed with hexane. The resultant solid was dried under reduced pressure at 60° C. for 24 hours to produce 4.9 parts of a compound represented by formula (AII-8).

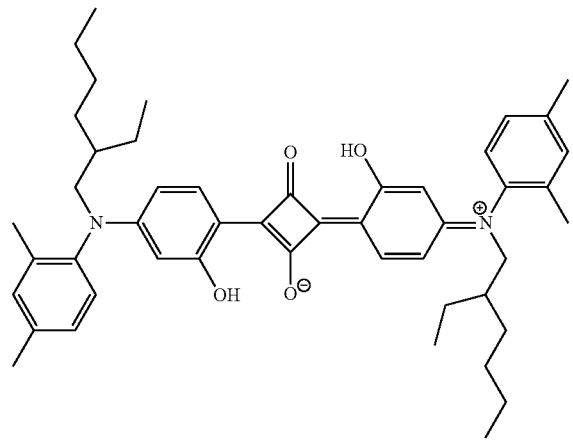

(AII-8)

The $^1$H-NMR data (270 MHz, δ value (ppm, relative to TMS), DMSO-d6) for the compound represented by formula (AII-8): 0.87 (m, 12H), 1.21-1.57 (m, 16H), 1.72 (br, 2H), 2.05 (s, 6H), 2.36 (s, 6H), 3.37 (br, 2H), 3.78 (br, 2H), 6.00 (br, 4H), 6.97-7.12 (m, 6H), 7.77-7.95 (m, 2H), 11.35 (s, 1H), 12.06 (s, 1H).

Synthesis Example 5

A proper amount of nitrogen was flown into a flask equipped with a reflux condenser, a dropping funnel and a stirrer to purge the inside of the flask with a nitrogen atmosphere, then 371 parts of propylene glycol monomethylether acetate was added to the mixture, then the mixture was heated to 85° C. while stirring. Subsequently, there was added dropwise, to the flask over 4 hours, a mixed solution, which was prepared by dissolving a mixture of 54 parts of acrylic acid, 3,4-epoxytricyclo[5.2.1.0$^{2,6}$]decan-8-ylacrylate and 225 parts of 3,4-epoxytricyclo[5.2.1.0$^{2,6}$]decan-9-ylacrylate (the content ratio was 50:50 by mole) and 81 parts of vinyltoluene (a mixture of isomers) in 80 parts of propylene glycol monomethylether acetate.

On the other hand, there was added dropwise, to the solution over 5 hours, a solution prepared by dissolving 30 parts of a polymerization initiator, 2,2-azo bis(2,4-dimethylvaleronitrile), in 160 parts of propylene glycol monomethylether acetate. After the completion of the dropwise addition of the initiator solution, the solution was retained at 85° C. for 4 hours and then cooled to room temperature to produce a copolymer (resin Bb) solution. The resin Bb solution had a solid content of 37% and a viscosity of 246 mPa·s as measured with a Type-B viscometer (23° C.). The resin Bb had a weight average molecular weight of 1.06× 10$^4$, an acid value of 115 mg-KOH/g in terms of solid content, and a molecular weight distribution of 2.01. The resin Bb has structural units shown below.

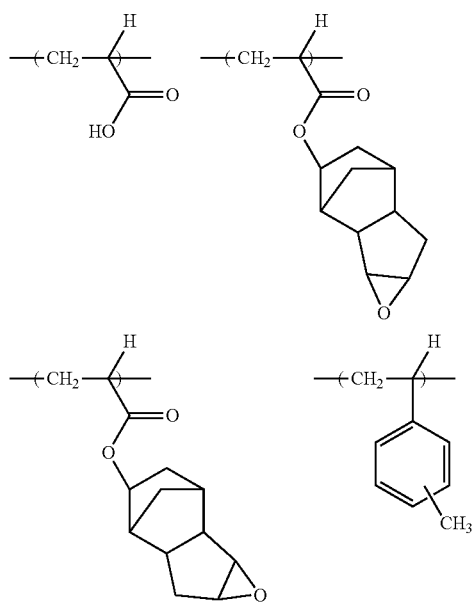

The measurement of the weight average molecular weight (Mw) and the number average molecular weight (Mn) of the resin was carried out using the GPC method under the following conditions.

Device; K2479 (manufactured by Shimadzu Corporation)

Column; SHIMADZU Shim-pack GPC-80M

Column temperature; 40° C.

Solvent; THF (tetrahydrofuran)

Flow rate; 1.0 mL/min.

Detector; RI

Reference substance for correction; TSK STANDARD POLYSTYRENE F-40, F-4, F-288, A-2500, A-500 (manufactured by Tosoh Corporation)

The ratio (Mw/Mn) of the weight average molecular weight to the number average molecular weight in terms of polystyrene content as determined above was defined as a molecular weight distribution.

<Preparation of Pigment Dispersions>

Pigment dispersions were prepared by mixing the components shown in Tables 1 and 2 so as to disperse the pigments satisfactorily using a bead mill.

TABLE 1

| | | Pigment dispersion | | | | | | | |
|---|---|---|---|---|---|---|---|---|---|
| | | R1 | R2 | R3 | G1 | G2 | G3 | B1 | B2 |
| Pigment | R1 | 12 | | | | | | | |
| | R2 | | 12 | | | | | | |
| | R3 | | | 12 | | | | | |
| | G1 | | | | 12 | | | | |
| | G2 | | | | | 14 | | | |
| | G3 | | | | | | 15 | | |
| | B1 | | | | | | | 12 | 9 |
| | V1 | | | | | | | | 3 |

TABLE 1-continued

| | | Pigment dispersion | | | | | | | |
|---|---|---|---|---|---|---|---|---|---|
| | | R1 | R2 | R3 | G1 | G2 | G3 | B1 | B2 |
| Pigment dispersing agent | | 6 | 3.6 | 6 | 3.9 | 4.1 | 2.3 | 4.8 | 4 |
| Resin Ba | | | 4.8 | | 4 | 3 | 4.5 | 3.6 | 4 |
| Solvent | Ea | 77 | 68 | 82 | 80 | 79 | 78 | 67 | 72 |
| | Eb | 5 | 12 | | | | | 13 | 8 |

TABLE 2

| | | Pigment dispersion | | | | | | |
|---|---|---|---|---|---|---|---|---|
| | | B3 | Y1 | Y2 | Y3 | Y4 | Y5 | Y6 |
| Pigment | B2 | 14 | | | | | | |
| | Y1 | | 13 | | | | | |
| | Y2 | | | 13 | | | | |
| | Y3 | | | | 12 | | | |
| | Y4 | | | | | 12 | | |
| | Y5 | | | | | | 12 | |
| | Y6 | | | | | | | 12 |
| Pigment dispersing agent | | 5 | 4 | 5.2 | 3.6 | 5.4 | 6 | 7.2 |
| Resin Ba | | 4 | 3 | 5.2 | 4 | 5.4 | 4.8 | 6 |
| Solvent | Ea | 57 | 71 | 77 | 80 | 77 | 77 | 70 |
| | Eb | 20 | 9 | | | | | 5 |

Pigment R1; C. I. Pigment Red 254

Pigment R2; C. I. Pigment Red 242

Pigment R3; C. I. Pigment Red 177

Pigment G1; C. I. Pigment Green 7

Pigment G2; C. I. Pigment Green 36

Pigment G3; C. I. Pigment Green 58

Pigment B1; C. I. Pigment Blue 15:6

Pigment B2; C. I. Pigment Blue 15:4

Pigment V1; C. I. Pigment Violet 23

Pigment Y1; C. I. Pigment Yellow 129

Pigment Y2; C. I. Pigment Yellow 138

Pigment Y3; C. I. Pigment Yellow 139

Pigment Y4; C. I. Pigment Yellow 150

Pigment Y5; C. I. Pigment Yellow 180

Pigment Y6; C. I. Pigment Yellow 185

Resin Ba; a methacrylic acid/benzyl methacrylate copolymer (copolymerization ratio (by mass); 30/70, Mw; $1.2 \times 10^4$)

Solvent Ea; propylene glycol monomethylether acetate

Solvent Eb; propylene glycol monomethyl ether

<Preparation of Red-Coloring Compositions>

Red-coloring compositions were prepared by mixing the components shown in Tables 3 to 6. In Tables 3 to 6, the number of parts of the resins is a value in terms of solid content.

TABLE 3

| | | Red-coloring composition | | | | | | | | |
|---|---|---|---|---|---|---|---|---|---|---|
| | | Rp1 | Rp2 | Rp3 | Rp4 | Rp5 | Rp6 | Rp7 | Rp8 | Rp9 |
| Pigment dispersion | R1 | 174 | 175 | 181 | 156 | 170 | 162 | | | |
| | R2 | | | | | | | 172 | 144 | 190 |
| | R3 | | | | | | | | | |
| | Y1 | | | 174 | | | | | | 165 |
| | Y2 | 113 | | | | | | 111 | | |
| | Y3 | | | | 150 | | | | | |
| | Y4 | | 145 | | | | | | 172 | |
| | Y5 | | | | | 103 | | | | |
| | Y6 | | | | | | 53 | | | |
| Resin | Bb | 28 | 24 | 27 | 29 | 29 | 33 | 24 | 19 | 23 |
| Polymerizable compound | | 50 | 50 | 50 | 50 | 50 | 50 | 50 | 50 | 50 |
| Polymerization initiator | | 15 | 15 | 15 | 15 | 15 | 15 | 15 | 15 | 15 |
| Solvent | Ea | 590 | 536 | 550 | 534 | 585 | 596 | 605 | 593 | 611 |
| | Eb | 34 | 35 | 20 | 35 | 33 | 29 | 22 | 26 | 8 |
| | Ec | | | 43 | 45 | 43 | | | | |
| Leveling agent | | 0.2 | 0.2 | 0.2 | 0.2 | 0.2 | 0.2 | 0.2 | 0.2 | 0.2 |

TABLE 4

| | | Red-coloring composition | | | | | | | | | |
|---|---|---|---|---|---|---|---|---|---|---|---|
| | | Rp10 | Rp11 | Rp12 | Rp13 | Rp14 | Rp15 | Rp16 | Rp17 | Rpx | Rpy |
| Pigment dispersion | R1 | | | | | 183 | | 192 | | 368 | 462 |
| | R2 | 151 | 101 | 54 | 255 | | 200 | | 232 | | |
| | R3 | | | | | | | | | 368 | |
| | Y1 | | | | | | | | | | |
| | Y2 | | | | | | | 78 | 49 | | 300 |
| | Y3 | 157 | | | | | | | | | |
| | Y4 | | | | | 117 | | 97 | | | |
| | Y5 | | 167 | | | | | | | | |
| | Y6 | | | 160 | | | | | | | |
| Resin | Bb | 25 | 23 | 24 | 29 | 26 | 25 | 28 | 25 | 6 | 1.2 |
| Polymerizable compound | | 50 | 50 | 50 | 50 | 50 | 50 | 50 | 50 | 50 | 40 |
| Polymerization initiator | | 15 | 15 | 15 | 15 | 15 | 15 | 15 | 15 | 15 | 15 |
| Solvent | Ea | 590 | 595 | 609 | 610 | 582 | 607 | 583 | 608 | 509 | 541 |
| | Eb | 25 | 30 | 25 | 11 | 34 | 18 | 33 | 15 | 39 | 36 |
| | Ec | | | | | | | | | | |
| Leveling agent | | 0.2 | 0.2 | 0.2 | 0.2 | 0.2 | 0.2 | 0.2 | 0.2 | 0.2 | 0.2 |

TABLE 5

| | | Red-coloring composition | | | | | | | | | | |
|---|---|---|---|---|---|---|---|---|---|---|---|---|
| | | Rh1 | Rh2 | Rh3 | Rh4 | Rh5 | Rh6 | Rh7 | Rh8 | Rh9 | Rh10 | Rh11 |
| Pigment dispersion | R1 | | | 159 | 172 | | | | | | | |
| | R2 | 158 | 170 | | | | | | | | | 189 |
| | R3 | | | | | | | | | | | |
| | Y1 | | | | | | | 187 | | | | |
| | Y2 | | | | | | 120 | | | | | |
| | Y3 | | | | | | | | 160 | | | |
| | Y4 | | | | | 151 | | | | | | |
| | Y5 | | | | | | | | | 108 | | |
| | Y6 | | | | | | | | | | 57 | |
| Dye | K1 | | | | | | | | | | | |
| | K2 | | | | | 19 | 18 | 19 | 16 | 18 | 17 | |
| | K3 | 5 | | 4 | | | | | | | | 3 |
| | K4 | | 13 | | 13 | | | | | | | |

TABLE 5-continued

| | | Red-coloring composition | | | | | | | | | | |
|---|---|---|---|---|---|---|---|---|---|---|---|
| | | Rh1 | Rh2 | Rh3 | Rh4 | Rh5 | Rh6 | Rh7 | Rh8 | Rh9 | Rh10 | Rh11 |
| Resin | Bb | 37 | 36 | 40 | 40 | 34 | 38 | 37 | 38 | 38 | 42 | 34 |
| Polymerizable compound | | 50 | 50 | 50 | 50 | 50 | 50 | 50 | 50 | 50 | 50 | 50 |
| Polymerization initiator | | 15 | 15 | 15 | 15 | 15 | 15 | 15 | 15 | 15 | 15 | 15 |
| Solvent | Ea | 599 | 643 | 584 | 627 | 399 | 413 | 405 | 383 | 412 | 431 | 590 |
| | Eb | 60 | 64 | 71 | 76 | 86 | 84 | 73 | 85 | 83 | 76 | 57 |
| | Ed | | | | | 258 | 253 | 269 | 256 | 248 | 236 | |
| Leveling agent | | 0.2 | 0.2 | 0.2 | 0.2 | 0.2 | 0.2 | 0.2 | 0.2 | 0.2 | 0.2 | 0.2 |

TABLE 6

| | | Red-coloring composition | | | | | | | | | |
|---|---|---|---|---|---|---|---|---|---|---|---|
| | | Rh12 | Rh13 | Rhx | Rd1 | Rd2 | Rd3 | Rd4 | Rd5 | Rd6 | Rd7 |
| Pigment dispersion | R1 | | | | | | | | | | |
| | R2 | 224 | 72 | 33 | | | | | | | |
| | R3 | | | | | | | | | | |
| | Y1 | | | | | | | | | | |
| | Y2 | | | | | | | | | | |
| | Y3 | | | | | | | | | | |
| | Y4 | | | | | | | | | | |
| | Y5 | | | | | | | | | | |
| | Y6 | | | | | | | | | | |
| Dye | K1 | | | | | | | 8 | 10 | | |
| | K2 | | | | 29 | 16 | 18 | | | 19 | 21 |
| | K3 | 2 | 2 | 0.9 | | 5 | | 9 | | 4 | 3 |
| | K4 | | | | | | 14 | | 31 | | |
| Resin | Bb | 31 | 44 | 47 | 50 | 50 | 50 | 50 | 50 | 50 | 50 |
| Polymerizable compound | | 50 | 50 | 50 | 50 | 50 | 50 | 50 | 50 | 50 | 50 |
| Polymerization initiator | | 15 | 15 | 15 | 15 | 15 | 15 | 15 | 15 | 15 | 15 |
| Solvent | Ea | 582 | 592 | 589 | 653 | 618 | 667 | 451 | 708 | 623 | 630 |
| | Eb | 55 | 63 | 64 | | | | | | | |
| | Ed | | | | 163 | 154 | 167 | 301 | 177 | 156 | 157 |
| Leveling agent | | 0.2 | 0.2 | 0.2 | 0.2 | 0.2 | 0.2 | 0.2 | 0.2 | 0.2 | 0.2 |

Dye K1; a compound represented by formula (I-7)
Dye K2; a compound represented by the formula shown below (which was synthesized by the method described in JP-A-2013-7032)

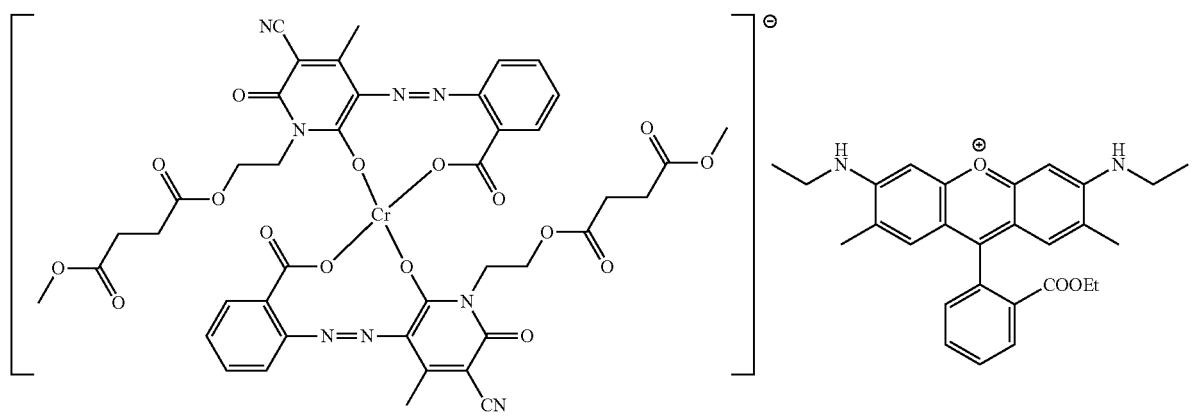

Dye K3; a compound represented by formula (Ad2-10)
Dye K4; C. I. Solvent Yellow 162
Resin Bb; resin Bb
Polymerizable compound; dipentaerythritol hexaacrylate (KAYARAD (registered trade name) DPHA; manufactured by Nippon Kayaku Co., Ltd.)
Polymerization initiator; Da; N-benzoyloxy-1-(4-phenylsulfanylphenyl)octan-1-one-2-imine (Irgacure (registered trade name) OXE-01; manufactured by BASF; an O-acyloxime compound)
Solvent; Ea; propylene glycol monomethylether acetate
Solvent; Eb; propylene glycol monomethyl ether
Solvent; Ec; ethyl 3-ethoxypropionate
Solvent; Ed; 4-hydroxy-4-methyl-2-pentanone
Leveling agent; polyether-modified silicone oil (Toray silicone SH8400; manufactured by Dow Corning Toray Co., Ltd.)

<Preparation of Green-Coloring Compositions>

Green-coloring compositions were prepared by mixing the components shown in Tables 7 to 9. In Tables 7 to 9, the number of parts of the resins is a value in terms of solid content.

TABLE 7

| | | \multicolumn{10}{c}{Green-coloring composition} |
|---|---|---|---|---|---|---|---|---|---|---|---|
| | | Gp1 | Gp2 | Gp3 | Gp4 | Gp5 | Gp6 | Gp7 | Gp8 | Gpx | Gpy |
| Pigment dispersion | G1 | | | 214 | 322 | | | | 452 | 219 | |
| | G2 | | | | | 582 | 405 | | | 85 | |
| | G3 | 401 | 297 | | | | | 760 | | | 560 |
| | Y1 | 252 | 0 | 261 | | 331 | | | | | 351 |
| | Y6 | | 81 | | 107 | | 99 | 58 | 120 | 60 | |
| | Y4 | | | | | | | | | | 209 |
| Resin | Bb | 15 | 29 | 25 | 20 | 0.6 | 18 | 0.5 | 8 | 6 | 2.2 |
| Polymerizable compound | | 40 | 40 | 40 | 40 | 35 | 40 | 40 | 40 | 40 | 35 |
| Polymerization initiator | | 15 | 15 | 15 | 15 | 15 | 15 | 15 | 15 | 15 | 15 |
| Solvent | Ea | 628 | 575 | 583 | 564 | 595 | 599 | 637 | 543 | 553 | 631 |
| | Eb | 36 | 44 | 26 | 42 | 38 | 47 | 64 | 46 | 50 | 38 |
| | Ec | | 48 | | | | | | | | |
| Leveling agent | | 0.2 | 0.2 | 0.2 | 0.2 | 0.2 | 0.2 | 0.2 | 0.2 | 0.2 | 0.2 |

TABLE 8

| | | \multicolumn{10}{c}{Green-coloring composition} |
|---|---|---|---|---|---|---|---|---|---|---|---|
| | | Gh1 | Gh2 | Gh3 | Gh4 | Gh5 | Gh6 | Gh7 | Gh8 | Gh9 | Gh10 |
| Pigment dispersion | G1 | 318 | 355 | | | | | | | | 452 |
| | G2 | | | | | 406 | 440 | | | | |
| | G3 | | | 321 | 317 | | | | 459 | 776 | |
| | Y1 | | | | | | | 459 | | | |
| | Y6 | | | | | | | | 127 | | |
| | Y4 | | | | | | | | | | |
| Dye | K5 | | | | | | | 31 | 21 | | |
| | K3 | 9.5 | | 7.8 | | 8.9 | | | | 5.2 | 10 |
| | K4 | | 28 | | 21 | | 26 | | | | |
| Resin | Bb | 25 | 22 | 28 | 28 | 21 | 19 | 18 | 33 | 7 | 24 |
| Polymerizable compound | | 50 | 50 | 50 | 50 | 50 | 50 | 50 | 50 | 40 | 40 |
| Polymerization initiator | | 15 | 15 | 15 | 15 | 15 | 15 | 15 | 15 | 15 | 15 |
| Solvent | Ea | 575 | 767 | 622 | 791 | 601 | 798 | 722 | 682 | 602 | 553 |
| | Eb | | | | | | | 75 | 79 | 134 | 102 |
| | Ed | 92 | | 97 | | 102 | | | | | |
| Leveling agent | | 0.2 | 0.2 | 0.2 | 0.2 | 0.2 | 0.2 | 0.2 | 0.2 | 0.2 | 0.2 |

TABLE 9

| | | \multicolumn{7}{c}{Green-coloring composition} |
|---|---|---|---|---|---|---|---|---|
| | | Gh11 | Gh12 | Gh13 | Ghx | Gd1 | Gd2 | Gd3 |
| Pigment dispersion | G1 | | | | | | | |
| | G2 | | | | | | | |
| | G3 | | 28 | 97 | 27 | | | |
| | Y1 | | | | | | | |
| | Y6 | 23 | | | | | | |
| | Y4 | | | | | | | |
| Dye | K5 | | | | | 21 | 24 | |
| | K3 | 6.5 | 8.1 | 2.4 | 0.7 | 11 | | 8.4 |
| | K4 | | | | | | 33 | |
| | K9 | 11 | 10 | | | | | 11 |
| Resin | Bb | 47 | 48 | 43 | 48 | 50 | 50 | 50 |
| Polymerizable compound | | 50 | 50 | 50 | 50 | 50 | 50 | 50 |
| Polymerization initiator | | 15 | 15 | 15 | 15 | 15 | 15 | 15 |
| Solvent | Ea | 673 | 678 | 597 | 590 | 749 | 875 | 685 |
| | Eb | | | | | | | |
| | Ed | 75 | 78 | 75 | 68 | 83 | 97 | 76 |
| Leveling agent | | 0.2 | 0.2 | 0.2 | 0.2 | 0.2 | 0.2 | 0.2 |

Dye K5; C. I. Solvent Blue 67

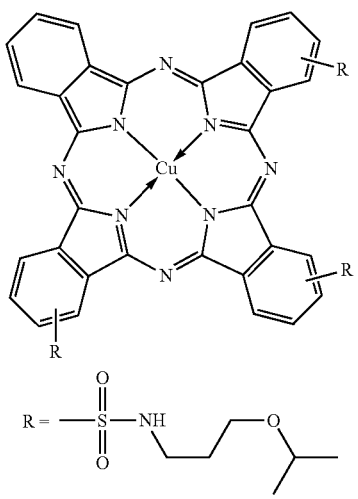

Dye K9; a compound represented by formula (AII-8)

<Preparation of Blue-Coloring Compositions>

Blue-coloring compositions were prepared by mixing the components shown in Tables 10 and 11. In Tables 10 and 11, the number of parts of the resins is a value in terms of solid content.

TABLE 10

| | | Blue-coloring composition | | | | | | |
|---|---|---|---|---|---|---|---|---|
| | | Bp1 | Bp2 | Bp3 | Bp4 | Bh1 | Bh2 | Bh3 |
| Pigment dispersion | B1 | 487 | 51 | 400 | 141 | 259 | 377 | 299 |
| | B2 | | | | | | | |
| | B3 | | | 367 | 120 | | | |
| Dye | K6 | | | | | | | |
| | K7 | | | | | | 2 | 3 |
| | K8 | | | | | 4 | | |
| Resin | Bb | 9 | 16 | 7 | 58 | 28 | 18 | 25 |
| Polymerizable compound | | 50 | 50 | 50 | 30 | 50 | 50 | 50 |
| Polymerization initiator | | 15 | 15 | 15 | 15 | 15 | 15 | 15 |
| Solvent | Ea | 558 | 581 | 563 | 504 | 498 | 492 | 497 |
| | Eb | 35 | 13 | 40 | 131 | 50 | 44 | 48 |
| | Ec | | 49 | | | | | |
| | Ed | | | | | 84 | 93 | 87 |
| Leveling agent | | 0.2 | 0.2 | 0.2 | 0.2 | 0.2 | 0.2 | 0.2 |

TABLE 11

| | | Blue-coloring composition | | | | | |
|---|---|---|---|---|---|---|---|
| | | Bh4 | Bh5 | Bd1 | Bpx | Bpy | Bhx |
| Pigment dispersion | B1 | 440 | | | | 789 | 39 |
| | B2 | | | | 594 | | |
| | B3 | | 193 | | | | |
| Dye | K6 | | | 36 | | | |
| | K7 | 1 | 3 | | | | |
| | K8 | | | | | | |
| Resin | Bb | 13 | 35 | 50 | 2 | 4 | 67 |
| Polymerizable compound | | 50 | 50 | 50 | 45 | 30 | 30 |
| Polymerization initiator | | 15 | 15 | 15 | 15 | 15 | 15 |

TABLE 11-continued

| | | Blue-coloring composition | | | | | |
|---|---|---|---|---|---|---|---|
| | | Bh4 | Bh5 | Bd1 | Bpx | Bpy | Bhx |
| Solvent | Ea | 472 | 518 | 769 | 506 | 422 | 518 |
| | Eb | 39 | 67 | 85 | 92 | 135 | 63 |
| | Ed | 96 | 82 | | | | 68 |
| Leveling agent | | 0.2 | 0.2 | 0.2 | 0.2 | 0.2 | 0.2 |

Dye K6; a compound represented by formula (Ab2-1)
Dye K7; a compound represented by the formula shown below (which was synthesized by the method described in JP-A-2013-64096)

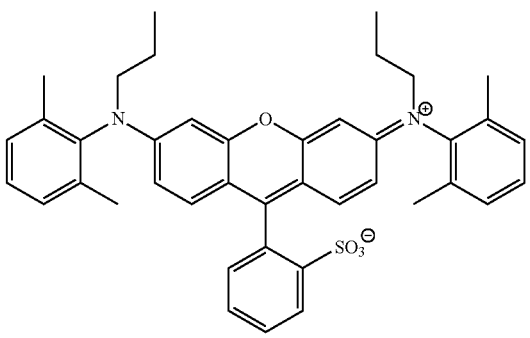

Dye K8; C. I. Basic Red 1

<Production of Color Filters>

A coloring composition was applied onto a 5-cm square glass substrate (EAGLE XG; manufactured by Corning Incorporated) by a spin coating method, and then prebaked at 100° C. for 3 minutes to form a coloring composition layer. After the layer was allowed to cool, the layer was irradiated with light at a light amount (reference: 365 nm) under an air atmosphere using an exposure machine (TME-150RSK; manufactured by Topcon Corporation) while keeping the distance between the substrate having the coloring composition layer formed thereon and a quartz glass-made photomask at 100 μm. As the photomask, a photomask having 100 μm line-and-space patterns formed thereon was used. The coloring composition layer that had been irradiated with light was developed by immersing the coloring composition layer in an aqueous developing solution containing a nonionic surfactant (0.12%) and potassium hydroxide (0.04%) at 24° C. for 60 seconds, then washed with water, and then post-baked in an oven at 230° C. for 30 minutes, thereby producing a color filter on the glass substrate.

<Measurement of Film Thickness>

The film thickness of the color filter was measured using a film thickness measurement device (DEKTAK3; manufactured by Nihon Shinku Gijutsu Kabushiki Gaisha). The film thicknesses of the color filters are shown in Tables 12 to 20.

<Evaluation of Chemical Resistance>

The resultant color filter was immersed in N-methylpyrrolidone at 60° C. for 40 minutes. The x-y chromaticity coordinate (x, y) and Y were measured before and after the immersion, and then the color difference ΔEab* was calculated from the measurement values by the method described in JIS Z 8730:2009 (7. Method for calculating color difference). The results are shown in Tables 12 to 20. The x-y chromaticity coordinate (x, y) and Y were determined by carrying out spectrometry with a color measurement device (OSP-SP-200; manufactured by Olympus Corporation) using a characteristic function for a C light source. A smaller ΔEab* value means that the degree of change in color is smaller. A sample having a ΔEab* value of 3 or less was rated "⊙", a sample having a ΔEab* value of more than 3 and 10 or less was rated "○", and a sample having a ΔEab* value of more than 10 was rated "×".

<Evaluation of Developability>

In the glass substrate having the color filter formed thereon, apart of the glass substrate on which the color filter was not formed (i.e., an unexposed part) was observed with an optical microscope. The rating of the evaluation are as follows: ○: no residue was observed, ×: residues were observed. The results are shown in Tables 12 to 20.

TABLE 12

| Coloring composition | Red color filter | | | | | | | | |
|---|---|---|---|---|---|---|---|---|---|
| | Rp1 | Rp2 | Rp3 | Rp4 | Rp5 | Rp6 | Rp7 | Rp8 | Rp9 |
| Thickness [μm] | 2.3 | 2.3 | 2.3 | 2.3 | 2.3 | 2.3 | 2.3 | 2.3 | 2.3 |
| Chemical resistance | ⊙ | ⊙ | ⊙ | ⊙ | ⊙ | ⊙ | ⊙ | ⊙ | ⊙ |
| Developability | ○ | ○ | ○ | ○ | ○ | ○ | ○ | ○ | ○ |
| FR × CR | 0.54 | 0.57 | 0.64 | 0.56 | 0.51 | 0.42 | 0.54 | 0.57 | 0.64 |

TABLE 13

| Coloring composition | Red color filter | | | | | | | | |
|---|---|---|---|---|---|---|---|---|---|
| | Rp10 | Rp11 | Rp12 | Rp13 | Rp14 | Rp15 | Rp16 | Rp17 | Rpx | Rpy |
| Thickness [μm] | 2.3 | 2.3 | 2.3 | 2.3 | 2.3 | 2.3 | 2.3 | 2.3 | 2.9 | 2.3 |
| Chemical resistance | ⊙ | ⊙ | ⊙ | ⊙ | ⊙ | ⊙ | ⊙ | ⊙ | X | X |
| Developability | ○ | ○ | ○ | ○ | ○ | ○ | ○ | ○ | X | X |
| FR × CR | 0.56 | 0.50 | 0.42 | 0.48 | 0.55 | 0.52 | 0.53 | 0.53 | 1.25 | 1.04 |

TABLE 14

| Coloring composition | Red color filter | | | | | | | | | | |
|---|---|---|---|---|---|---|---|---|---|---|---|
| | Rh1 | Rh2 | Rh3 | Rh4 | Rh5 | Rh6 | Rh7 | Rh8 | Rh9 | Rh10 | Rh11 |
| Thickness [μm] | 2.3 | 2.3 | 2.3 | 2.3 | 2.3 | 2.3 | 2.3 | 2.3 | 2.3 | 2.3 | 2.3 |
| Chemical resistance | ⊙ | ⊙ | ⊙ | ⊙ | ⊙ | ⊙ | ⊙ | ⊙ | ⊙ | ⊙ | ⊙ |
| Developability | ○ | ○ | ○ | ○ | ○ | ○ | ○ | ○ | ○ | ○ | ○ |
| FR × CR | 0.39 | 0.52 | 0.39 | 0.52 | 0.56 | 0.52 | 0.63 | 0.54 | 0.48 | 0.39 | 0.42 |

TABLE 15

| Coloring composition | Red color filter | | | | | | | | | |
|---|---|---|---|---|---|---|---|---|---|---|
| | Rh12 | Rh13 | Rhx | Rd1 | Rd2 | Rd3 | Rd4 | Rd5 | Rd6 | Rd7 |
| Thickness [μm] | 2.3 | 2.3 | 2.3 | 2.3 | 2.3 | 2.3 | 2.3 | 2.3 | 2.3 | 2.3 |
| Chemical resistance | ⊙ | ⊙ | ⊙ | ⊙ | ⊙ | ⊙ | ⊙ | ⊙ | ⊙ | ⊙ |
| Developability | ○ | ○ | ○ | ○ | ○ | ○ | ○ | ○ | ○ | ○ |
| FR × CR | 0.46 | 0.19 | 0.09 | 0.46 | 0.36 | 0.50 | 0.30 | 0.60 | 0.37 | 0.59 |

TABLE 16

| Coloring composition | Green color filter | | | | | | | | | |
|---|---|---|---|---|---|---|---|---|---|---|
| | Gp1 | Gp2 | Gp3 | Gp4 | Gp5 | Gp6 | Gp7 | Gp8 | Gpx | Gpy |
| Thickness [μm] | 2.3 | 2.16 | 2.3 | 2.3 | 2.3 | 2.3 | 2.3 | 2.3 | 5.3 | 2.3 |
| Chemical resistance | ⊙ | ⊙ | ⊙ | ⊙ | ⊙ | ○ | ○ | ⊙ | X | X |
| Developability | ○ | ○ | ○ | ○ | ○ | ○ | ○ | ○ | X | X |
| FG × CG | 1.03 | 0.74 | 0.75 | 0.71 | 1.19 | 0.86 | 1.18 | 0.86 | 2.02 | 1.22 |

TABLE 17

| Coloring composition | Green color filter | | | | | | | | | |
|---|---|---|---|---|---|---|---|---|---|---|
| | Gh1 | Gh2 | Gh3 | Gh4 | Gh5 | Gh6 | Gh7 | Gh8 | Gh9 | Gh10 |
| Thickness [μm] | 2.3 | 2.3 | 2.19 | 2.3 | 2.3 | 2.3 | 2.3 | 2.3 | 2.3 | 2.3 |
| Chemical resistance | ⊙ | ⊙ | ⊙ | ⊙ | ⊙ | ⊙ | ⊙ | ⊙ | ⊙ | ⊙ |
| Developability | ○ | ○ | ○ | ○ | ○ | ○ | ○ | ○ | ○ | ○ |
| FG × CG | 0.72 | 0.86 | 0.72 | 0.86 | 0.84 | 0.99 | 1.01 | 0.55 | 1.18 | 0.83 |

TABLE 18

| Coloring composition | Green color filter | | | | | | |
|---|---|---|---|---|---|---|---|
| | Gh11 | Gh12 | Gh13 | Ghx | Gd1 | Gd2 | Gd3 |
| Thickness [μm] | 2.3 | 2.3 | 2.3 | 2.3 | 2.3 | 2.3 | 2.3 |
| Chemical resistance | ⊙ | ⊙ | ⊙ | ⊙ | ⊙ | ⊙ | ⊙ |
| Developability | ○ | ○ | ○ | ○ | ○ | ○ | ○ |
| FG × CG | 0.34 | 0.37 | 0.29 | 0.09 | 0.50 | 0.76 | 0.33 |

TABLE 19

| Coloring composition | Blue color filter | | | | | | |
|---|---|---|---|---|---|---|---|
| | Bp1 | Bp2 | Bp3 | Bp4 | Bh1 | Bh2 | Bh3 |
| Thickness [μm] | 2.3 | 2.3 | 2.3 | 2.3 | 2.3 | 2.3 | 2.3 |
| Chemical resistance | ⊙ | ⊙ | ⊙ | ⊙ | ⊙ | ⊙ | ⊙ |
| Developability | ○ | ○ | ○ | ○ | ○ | ○ | ○ |
| FB × CB | 0.77 | 0.77 | 0.83 | 0.29 | 0.54 | 0.60 | 0.58 |

TABLE 20

| Coloring composition | Blue color filter | | | | | |
|---|---|---|---|---|---|---|
| | Bh4 | Bh5 | Bd1 | Bpx | Bpy | Bhx |
| Thickness [μm] | 2.3 | 2.3 | 2.3 | 0.7 | 2.3 | 2.3 |
| Chemical resistance | ⊙ | ⊙ | ⊙ | X | X | ⊙ |
| Developability | ○ | ○ | ○ | X | X | ○ |
| FB × CB | 0.73 | 0.47 | 0.62 | 0.28 | 1.04 | 0.09 |

Examples 1 to 90 and Comparative Examples 1 to 6

<Production of Color Filter Layers>

The color filter layers of Examples were produced by combining the color filters shown in Tables 12 to 20.

The above-mentioned method was repeated on a glass substrate having a black matrix formed thereon using a red-coloring composition, green-coloring composition and a blue-coloring composition to produce a color filter layer having a red color filter, a green color filter and a blue color filter.

<Measurement of Film Thickness>

The film thickness of each of the red color filter, the green color filter and the blue color filter which constituted the color filter layer was measured using a film thickness measurement device (DEKTAK3; manufactured by Nihon Shinku Gijutsu Kabushiki Gaisha). The film thicknesses of the color filters are shown in Tables 22 to 25.

<Evaluation of Chromaticity>

Each of the red color filter, the green color filter and the blue color filter that constituted the color filter layer was subjected to spectrometry with a color measurement device (OSP-SP-200; manufactured by Olympus Corporation), and then a x-y chromaticity coordinate (x, y) and a tristimulus value Y in the CIE XYZ color system were determined using the characteristic function for light emitted from a light-emitting device as shown below. A larger Y value means that the lightness is higher.

The light-emitting device used in the evaluation of the chromaticity contains a light source that comprises a blue LED and a color conversion layer that contains quantum dots. The values relating to the wave shape of light emitted from the light-emitting device are as shown in Table 21. In Comparative Example 1 and Comparative Example 6, a pseudo-white LED was used as the light-emitting device. The results are shown in Tables 22 to 25.

<Evaluation of Color Filter Layers>

With respect to each of the color filter layers, a x-y chromaticity coordinate in white display (Wx, Wy), a tristimulus value WY, a color temperature and color reproducibility were determined. The results are shown in Tables 26 to 29.

The x-y chromaticity coordinate in white display (Wx, Wy), the tristimulus value WY and the color temperature were determined by the method prescribed in Japanese Industrial Standards (JIS) Z 8725 from the value of the x-y chromaticity coordinate (x, y) and the tristimulus value Y for each of the color filters.

As the color reproducibility, the ratio of an area surrounded by the x-y chromaticity coordinates in each of the color filters to an area surrounded by three primary colors (red (0.64, 0.33), green (0.21, 0.71), blue (0.15, 0.06)) of AdobeRGB defined by Adobe Systems was determined.

TABLE 21

| | First emission peak | | Second emission peak | | Third emission peak | |
|---|---|---|---|---|---|---|
| | $\lambda_1$ | Half width | $\lambda_2$ | Half width | $\lambda_3$ | Half width |
| Light-emitting device 1 | 445 | 18.6 | 535 | 34.8 | 635 | 32.6 |
| Light-emitting device 2 | 445 | 18.6 | 535 | 41.6 | 635 | 41.0 |
| Light-emitting device 3 | 445 | 18.6 | 535 | 49.1 | 635 | 49.6 |
| Light-emitting device 4 | 445 | 18.6 | 535 | 34.8 | 660 | 32.6 |

TABLE 22

| | Light-emitting device | | Red color filter | | | | | Green color filter | | |
|---|---|---|---|---|---|---|---|---|---|---|
| | | | $F_R$ | x | y | Y | $F_R \times C_R$ | $F_G$ | x | y |
| Example 1 | 1 | Rp1 | 2.3 | 0.640 | 0.330 | 30.7 | 0.54 | Gp1 | 2.3 | 0.210 | 0.710 |
| Example 2 | 1 | Rp1 | 2.3 | 0.640 | 0.330 | 30.7 | 0.54 | Gp2 | 2.16 | 0.210 | 0.710 |
| Example 3 | 1 | Rp1 | 2.3 | 0.640 | 0.330 | 30.7 | 0.54 | Gp3 | 2.3 | 0.210 | 0.710 |
| Example 4 | 1 | Rp1 | 2.3 | 0.640 | 0.330 | 30.7 | 0.54 | Gp4 | 2.3 | 0.210 | 0.710 |
| Example 5 | 1 | Rp1 | 2.3 | 0.640 | 0.330 | 30.7 | 0.54 | Gp5 | 2.3 | 0.210 | 0.710 |
| Example 6 | 1 | Rp1 | 2.3 | 0.640 | 0.330 | 30.7 | 0.54 | Gp6 | 2.3 | 0.210 | 0.710 |
| Example 7 | 1 | Rp1 | 2.3 | 0.640 | 0.330 | 30.7 | 0.54 | Gh1 | 2.3 | 0.210 | 0.710 |
| Example 8 | 1 | Rp1 | 2.3 | 0.640 | 0.330 | 30.7 | 0.54 | Gh2 | 2.3 | 0.210 | 0.710 |
| Example 9 | 1 | Rp1 | 2.3 | 0.640 | 0.330 | 30.7 | 0.54 | Gh3 | 2.19 | 0.210 | 0.710 |
| Example 10 | 1 | Rp1 | 2.3 | 0.640 | 0.330 | 30.7 | 0.54 | Gh4 | 2.3 | 0.210 | 0.710 |
| Example 11 | 1 | Rp1 | 2.3 | 0.640 | 0.330 | 30.7 | 0.54 | Gh5 | 2.3 | 0.210 | 0.710 |
| Example 12 | 1 | Rp1 | 2.3 | 0.640 | 0.330 | 30.7 | 0.54 | Gh6 | 2.3 | 0.210 | 0.710 |
| Example 13 | 1 | Rp1 | 2.3 | 0.640 | 0.330 | 30.7 | 0.54 | Gh7 | 2.3 | 0.210 | 0.710 |
| Example 14 | 1 | Rp1 | 2.3 | 0.640 | 0.330 | 30.7 | 0.54 | Gh8 | 2.3 | 0.210 | 0.710 |
| Example 15 | 1 | Rp1 | 2.3 | 0.640 | 0.330 | 30.7 | 0.54 | Gd1 | 2.3 | 0.210 | 0.710 |
| Example 16 | 1 | Rp1 | 2.3 | 0.640 | 0.330 | 30.7 | 0.54 | Gd2 | 2.3 | 0.210 | 0.710 |
| Example 17 | 1 | Rp2 | 2.3 | 0.640 | 0.330 | 30.6 | 0.57 | Gp2 | 2.16 | 0.210 | 0.710 |
| Example 18 | 1 | Rp3 | 2.3 | 0.640 | 0.330 | 29.5 | 0.64 | Gp2 | 2.16 | 0.210 | 0.710 |
| Example 19 | 1 | Rp4 | 2.3 | 0.640 | 0.330 | 30.4 | 0.56 | Gp2 | 2.16 | 0.210 | 0.710 |
| Example 20 | 1 | Rp5 | 2.3 | 0.640 | 0.330 | 30.6 | 0.51 | Gp2 | 2.16 | 0.210 | 0.710 |
| Example 21 | 1 | Rp6 | 2.3 | 0.640 | 0.330 | 30.6 | 0.42 | Gp2 | 2.16 | 0.210 | 0.710 |
| Example 22 | 1 | Rp7 | 2.3 | 0.640 | 0.330 | 31.3 | 0.54 | Gp2 | 2.16 | 0.210 | 0.710 |
| Example 23 | 1 | Rp8 | 2.3 | 0.640 | 0.330 | 31.1 | 0.57 | Gp2 | 2.16 | 0.210 | 0.710 |
| Example 24 | 1 | Rp9 | 2.3 | 0.640 | 0.330 | 30.0 | 0.64 | Gp2 | 2.16 | 0.210 | 0.710 |
| Example 25 | 1 | Rp10 | 2.3 | 0.640 | 0.330 | 30.9 | 0.56 | Gp2 | 2.16 | 0.210 | 0.710 |
| Example 26 | 1 | Rp11 | 2.3 | 0.640 | 0.330 | 31.2 | 0.50 | Gp2 | 2.16 | 0.210 | 0.710 |
| Example 27 | 1 | Rp12 | 2.3 | 0.640 | 0.330 | 31.1 | 0.42 | Gp2 | 2.16 | 0.210 | 0.710 |
| Example 28 | 1 | Rp13 | 2.3 | 0.640 | 0.292 | 26.7 | 0.48 | Gp2 | 2.16 | 0.210 | 0.710 |
| Example 29 | 1 | Rh1 | 2.3 | 0.640 | 0.330 | 31.5 | 0.39 | Gh1 | 2.3 | 0.210 | 0.710 |
| Example 30 | 1 | Rh1 | 2.3 | 0.640 | 0.330 | 31.5 | 0.39 | Gh2 | 2.3 | 0.210 | 0.710 |

| | Green color filter | | Blue color filter | | | | | |
|---|---|---|---|---|---|---|---|---|
| | Y | $F_G \times C_G$ | | $F_B$ | x | y | Y | $F_B \times C_B$ | $\sigma_F$ |
| Example 1 | 54.8 | 1.03 | Bp2 | 2.3 | 0.150 | 0.060 | 9.9 | 0.77 | 0.00 |
| Example 2 | 59.4 | 0.74 | Bp2 | 2.3 | 0.150 | 0.060 | 9.9 | 0.77 | 0.07 |
| Example 3 | 50.2 | 0.75 | Bp2 | 2.3 | 0.150 | 0.060 | 9.9 | 0.77 | 0.00 |
| Example 4 | 48.7 | 0.71 | Bp2 | 2.3 | 0.150 | 0.060 | 9.9 | 0.77 | 0.00 |
| Example 5 | 51.3 | 1.19 | Bp2 | 2.3 | 0.150 | 0.060 | 9.9 | 0.77 | 0.00 |
| Example 6 | 56.4 | 0.86 | Bp2 | 2.3 | 0.150 | 0.060 | 9.9 | 0.77 | 0.00 |
| Example 7 | 49.6 | 0.67 | Bp2 | 2.3 | 0.150 | 0.060 | 9.9 | 0.77 | 0.00 |
| Example 8 | 50.2 | 0.87 | Bp2 | 2.3 | 0.150 | 0.060 | 9.9 | 0.77 | 0.00 |
| Example 9 | 60.2 | 0.72 | Bp2 | 2.3 | 0.150 | 0.060 | 9.9 | 0.77 | 0.05 |
| Example 10 | 60.7 | 0.86 | Bp2 | 2.3 | 0.150 | 0.060 | 9.9 | 0.77 | 0.00 |
| Example 11 | 57.3 | 0.84 | Bp2 | 2.3 | 0.150 | 0.060 | 9.9 | 0.77 | 0.00 |
| Example 12 | 57.9 | 0.99 | Bp2 | 2.3 | 0.150 | 0.060 | 9.9 | 0.77 | 0.00 |
| Example 13 | 41.9 | 1.01 | Bp2 | 2.3 | 0.150 | 0.060 | 9.9 | 0.77 | 0.00 |
| Example 14 | 48.9 | 0.55 | Bp2 | 2.3 | 0.150 | 0.060 | 9.9 | 0.77 | 0.00 |
| Example 15 | 50.1 | 0.50 | Bp2 | 2.3 | 0.150 | 0.060 | 9.9 | 0.77 | 0.00 |
| Example 16 | 50.9 | 0.76 | Bp2 | 2.3 | 0.150 | 0.060 | 9.9 | 0.77 | 0.00 |
| Example 17 | 59.4 | 0.74 | Bp2 | 2.3 | 0.150 | 0.060 | 9.9 | 0.77 | 0.07 |
| Example 18 | 59.4 | 0.74 | Bp1 | 2.3 | 0.151 | 0.060 | 11.3 | 0.77 | 0.07 |
| Example 19 | 59.4 | 0.74 | Bp1 | 2.3 | 0.151 | 0.060 | 11.3 | 0.77 | 0.07 |
| Example 20 | 59.4 | 0.74 | Bp1 | 2.3 | 0.151 | 0.060 | 11.3 | 0.77 | 0.07 |
| Example 21 | 59.4 | 0.74 | Bp1 | 2.3 | 0.151 | 0.060 | 11.3 | 0.77 | 0.07 |
| Example 22 | 59.4 | 0.74 | Bp1 | 2.3 | 0.151 | 0.060 | 11.3 | 0.77 | 0.07 |
| Example 23 | 59.4 | 0.74 | Bp1 | 2.3 | 0.151 | 0.060 | 11.3 | 0.77 | 0.07 |
| Example 24 | 59.4 | 0.74 | Bp1 | 2.3 | 0.151 | 0.060 | 11.3 | 0.77 | 0.07 |
| Example 25 | 59.4 | 0.74 | Bp1 | 2.3 | 0.151 | 0.060 | 11.3 | 0.77 | 0.07 |
| Example 26 | 59.4 | 0.74 | Bp1 | 2.3 | 0.151 | 0.060 | 11.3 | 0.77 | 0.07 |
| Example 27 | 59.4 | 0.74 | Bp1 | 2.3 | 0.151 | 0.060 | 11.3 | 0.77 | 0.07 |
| Example 28 | 59.4 | 0.74 | Bp1 | 2.3 | 0.151 | 0.060 | 11.3 | 0.77 | 0.07 |
| Example 29 | 60.2 | 0.72 | Bh1 | 2.3 | 0.152 | 0.060 | 12.3 | 0.51 | 0.00 |
| Example 30 | 60.7 | 0.86 | Bh1 | 2.3 | 0.152 | 0.060 | 12.3 | 0.51 | 0.00 |

TABLE 23

| | Light-emitting device | | Red color filter | | | | | Green color filter | | | | Y | $F_G \times C_G$ | Blue color filter | | | | | | $\sigma_F$ |
|---|---|---|---|---|---|---|---|---|---|---|---|---|---|---|---|---|---|---|---|
| | | | $F_R$ | x | y | Y | $F_R \times C_R$ | | $F_G$ | x | y | | | | $F_B$ | x | y | Y | $F_B \times C_B$ | |
| Example 31 | 1 | Rh1 | 2.3 | 0.640 | 0.330 | 31.5 | 0.39 | Gh3 | 2.19 | 0.210 | 0.710 | 60.2 | 0.72 | Bp1 | 2.3 | 0.151 | 0.060 | 11.3 | 0.77 | 0.05 |
| Example 32 | 1 | Rh1 | 2.3 | 0.640 | 0.330 | 31.5 | 0.39 | Gh4 | 2.3 | 0.210 | 0.710 | 60.7 | 0.86 | Bh1 | 2.3 | 0.152 | 0.060 | 12.3 | 0.51 | 0.00 |
| Example 33 | 1 | Rh1 | 2.3 | 0.640 | 0.330 | 31.5 | 0.39 | Gh5 | 2.3 | 0.210 | 0.710 | 57.3 | 0.84 | Bp1 | 2.3 | 0.151 | 0.060 | 11.3 | 0.77 | 0.00 |
| Example 34 | 1 | Rh1 | 2.3 | 0.640 | 0.330 | 31.5 | 0.39 | Gh6 | 2.3 | 0.210 | 0.710 | 57.9 | 0.99 | Bp1 | 2.3 | 0.151 | 0.060 | 11.3 | 0.77 | 0.00 |
| Example 35 | 1 | Rh1 | 2.3 | 0.640 | 0.330 | 31.5 | 0.39 | Gh7 | 2.3 | 0.210 | 0.710 | 41.9 | 1.01 | Bh1 | 2.3 | 0.152 | 0.060 | 12.3 | 0.51 | 0.00 |
| Example 36 | 1 | Rh1 | 2.3 | 0.640 | 0.330 | 31.5 | 0.39 | Gh8 | 2.3 | 0.210 | 0.710 | 48.9 | 0.55 | Bp1 | 2.3 | 0.151 | 0.060 | 11.3 | 0.77 | 0.00 |
| Example 37 | 1 | Rh2 | 2.3 | 0.640 | 0.330 | 31.4 | 0.52 | Gh4 | 2.3 | 0.210 | 0.710 | 60.7 | 0.86 | Bp1 | 2.3 | 0.151 | 0.060 | 11.3 | 0.77 | 0.00 |
| Example 38 | 1 | Rh2 | 2.3 | 0.640 | 0.330 | 31.4 | 0.52 | Gh3 | 2.19 | 0.210 | 0.710 | 60.2 | 0.72 | Bh1 | 2.3 | 0.152 | 0.060 | 12.3 | 0.51 | 0.05 |
| Example 39 | 1 | Rh3 | 2.3 | 0.640 | 0.330 | 31.0 | 0.39 | Gh3 | 2.19 | 0.210 | 0.710 | 60.2 | 0.72 | Bh1 | 2.3 | 0.152 | 0.060 | 12.3 | 0.51 | 0.05 |
| Example 40 | 1 | Rh4 | 2.3 | 0.640 | 0.330 | 30.8 | 0.52 | Gh3 | 2.19 | 0.210 | 0.710 | 60.2 | 0.72 | Bp2 | 2.3 | 0.150 | 0.060 | 9.9 | 0.77 | 0.05 |
| Example 41 | 1 | Rh5 | 2.3 | 0.640 | 0.330 | 30.8 | 0.56 | Gh3 | 2.19 | 0.210 | 0.710 | 60.2 | 0.72 | Bh1 | 2.3 | 0.152 | 0.060 | 12.3 | 0.51 | 0.05 |
| Example 42 | 1 | Rh6 | 2.3 | 0.640 | 0.330 | 30.9 | 0.52 | Gh3 | 2.19 | 0.210 | 0.710 | 60.2 | 0.72 | Bp2 | 2.3 | 0.150 | 0.060 | 9.9 | 0.77 | 0.05 |
| Example 43 | 1 | Rh7 | 2.3 | 0.640 | 0.330 | 29.6 | 0.63 | Gh3 | 2.19 | 0.210 | 0.710 | 60.2 | 0.72 | Bp1 | 2.3 | 0.151 | 0.060 | 11.3 | 0.77 | 0.05 |
| Example 44 | 1 | Rh8 | 2.3 | 0.640 | 0.330 | 30.6 | 0.54 | Gh3 | 2.19 | 0.210 | 0.710 | 60.2 | 0.72 | Bh1 | 2.3 | 0.152 | 0.060 | 12.3 | 0.51 | 0.05 |
| Example 45 | 1 | Rh9 | 2.3 | 0.640 | 0.330 | 30.8 | 0.48 | Gh3 | 2.19 | 0.210 | 0.710 | 60.2 | 0.72 | Bh1 | 2.3 | 0.152 | 0.060 | 12.3 | 0.51 | 0.05 |
| Example 46 | 1 | Rh10 | 2.3 | 0.640 | 0.330 | 30.8 | 0.39 | Gh3 | 2.19 | 0.210 | 0.710 | 60.2 | 0.72 | Bp2 | 2.3 | 0.150 | 0.060 | 9.9 | 0.77 | 0.05 |
| Example 47 | 1 | Rd1 | 2.3 | 0.640 | 0.288 | 26.6 | 0.46 | Gh3 | 2.19 | 0.210 | 0.710 | 60.2 | 0.72 | Bh1 | 2.3 | 0.152 | 0.060 | 12.3 | 0.51 | 0.05 |
| Example 48 | 1 | Rd2 | 2.3 | 6.640 | 0.330 | 31.2 | 0.36 | Gh3 | 2.19 | 0.210 | 0.710 | 60.2 | 0.72 | Bh1 | 2.3 | 0.152 | 0.060 | 12.3 | 0.51 | 0.05 |
| Example 49 | 1 | Rd2 | 2.3 | 0.640 | 0.330 | 31.2 | 0.36 | Gd1 | 2.3 | 0.210 | 0.710 | 50.1 | 0.50 | Bh1 | 2.3 | 0.152 | 0.060 | 12.3 | 0.51 | 0.00 |
| Example 50 | 1 | Rd2 | 2.3 | 0.640 | 0.330 | 31.2 | 0.36 | Gd2 | 2.3 | 0.210 | 0.710 | 50.9 | 0.76 | Bh1 | 2.3 | 0.152 | 0.060 | 12.3 | 0.51 | 0.00 |
| Example 51 | 1 | Rd3 | 2.3 | 0.640 | 0.330 | 31.0 | 0.50 | Gh3 | 2.19 | 0.210 | 0.710 | 60.2 | 0.72 | Bh1 | 2.3 | 0.152 | 0.060 | 12.3 | 0.51 | 0.05 |
| Example 52 | 1 | Rd4 | 2.3 | 0.640 | 0.330 | 30.1 | 0.30 | Gh3 | 2.19 | 0.210 | 0.710 | 60.2 | 0.72 | Bh1 | 2.3 | 0.152 | 0.060 | 12.3 | 0.51 | 0.05 |
| Example 53 | 1 | Rd5 | 2.3 | 0.640 | 0.330 | 29.7 | 0.60 | Gh3 | 2.19 | 0.210 | 0.710 | 60.2 | 0.72 | Bh1 | 2.3 | 0.152 | 0.060 | 12.3 | 0.51 | 0.05 |
| Example 54 | 1 | Rh1 | 2.3 | 0.640 | 0.330 | 31.5 | 0.39 | Gp1 | 2.3 | 0.210 | 0.710 | 54.8 | 1.03 | Bd1 | 2.3 | 0.152 | 0.060 | 13.4 | 0.55 | 0.00 |
| Example 55 | 1 | Rd2 | 2.3 | 0.640 | 0.330 | 31.2 | 0.36 | Gh3 | 2.19 | 0.210 | 0.710 | 60.2 | 0.72 | Bd1 | 2.3 | 0.152 | 0.060 | 13.4 | 0.55 | 0.05 |
| Example 56 | 1 | Rh1 | 2.3 | 0.640 | 0.330 | 31.5 | 0.39 | Gh3 | 2.19 | 0.210 | 0.710 | 60.2 | 0.72 | Bh2 | 2.3 | 0.153 | 0.060 | 11.6 | 0.56 | 0.05 |
| Example 57 | 2 | Rp1 | 2.32 | 0.640 | 0.336 | 32.7 | 0.55 | Gp2 | 2.50 | 0.226 | 0.710 | 55.9 | 0.85 | Bp2 | 2.50 | 0.149 | 0.060 | 8.1 | 0.83 | 0.08 |
| Example 58 | 2 | Rp1 | 2.32 | 0.640 | 0.336 | 32.7 | 0.55 | Gh3 | 2.33 | 0.229 | 0.710 | 58.3 | 0.76 | Bp2 | 2.50 | 0.149 | 0.060 | 8.1 | 0.83 | 0.08 |
| Example 59 | 2 | Rp7 | 2.43 | 0.640 | 0.340 | 34.0 | 0.57 | Gp2 | 2.50 | 0.226 | 0.710 | 55.9 | 0.85 | Bp1 | 2.47 | 0.150 | 0.060 | 9.4 | 0.83 | 0.03 |
| Example 60 | 2 | Rh1 | 2.42 | 0.640 | 0.340 | 34.2 | 0.41 | Gh1 | 2.29 | 0.224 | 0.709 | 47.8 | 0.67 | Bh1 | 2.44 | 0.152 | 0.060 | 10.3 | 0.54 | 0.07 |

TABLE 24

| | Light-emitting device | | Red color filter | | | | | Green color filter | | |
|---|---|---|---|---|---|---|---|---|---|---|
| | | | $F_R$ | x | y | Y | $F_R \times C_R$ | | $F_G$ | x | y |
| Example 61 | 2 | Rh1 | 2.42 | 0.640 | 0.340 | 34.2 | 0.41 | Gh2 | 2.48 | 0.217 | 0.710 |
| Example 62 | 2 | Rh1 | 2.42 | 0.640 | 0.340 | 34.2 | 0.41 | Gh3 | 2.33 | 0.229 | 0.710 |
| Example 63 | 2 | Rd1 | 2.30 | 0.640 | 0.302 | 29.3 | 0.46 | Gh3 | 2.33 | 0.229 | 0.710 |
| Example 64 | 2 | Rd2 | 2.38 | 0.640 | 0.338 | 33.7 | 0.37 | Gh3 | 2.33 | 0.229 | 0.710 |
| Example 65 | 2 | Rh1 | 2.42 | 0.640 | 0.340 | 34.2 | 0.41 | Gh3 | 2.33 | 0.229 | 0.710 |
| Example 66 | 2 | Rp14 | 2.3 | 0.640 | 0.330 | 31.9 | 0.55 | Gp7 | 2.3 | 0.210 | 0.710 |
| Example 67 | 2 | Rp15 | 2.3 | 0.640 | 0.330 | 32.9 | 0.52 | Gp7 | 2.3 | 0.210 | 0.710 |
| Example 68 | 2 | Rh11 | 2.3 | 0.640 | 0.330 | 33.0 | 0.42 | Gh9 | 2.3 | 0.210 | 0.710 |
| Example 69 | 2 | Rd6 | 2.3 | 0.640 | 0.330 | 32.7 | 0.37 | Gh9 | 2.3 | 0.210 | 0.710 |
| Example 70 | 3 | Rp1 | 2.4 | 0.640 | 0.340 | 33.8 | 0.56 | Gh3 | 2.73 | 0.236 | 0.710 |
| Example 71 | 3 | Rp7 | 2.6 | 0.640 | 0.346 | 35.6 | 0.59 | Gp2 | 2.95 | 0.232 | 0.710 |
| Example 72 | 3 | Rh1 | 2.6 | 0.640 | 0.346 | 35.8 | 0.43 | Gh1 | 2.5 | 0.225 | 0.710 |
| Example 73 | 3 | Rh1 | 2.6 | 0.640 | 0.346 | 35.8 | 0.43 | Gh2 | 2.7 | 0.218 | 0.710 |
| Example 74 | 3 | Rh1 | 2.6 | 0.640 | 0.346 | 35.8 | 0.43 | Gh3 | 2.73 | 0.236 | 0.710 |
| Example 75 | 3 | Rd1 | 2.3 | 0.640 | 0.311 | 31.0 | 0.47 | Gh3 | 2.73 | 0.236 | 0.710 |
| Example 76 | 3 | Rd2 | 2.5 | 0.640 | 0.344 | 35.2 | 0.39 | Gh3 | 2.73 | 0.236 | 0.710 |
| Example 77 | 3 | Rh1 | 2.6 | 0.640 | 0.346 | 35.8 | 0.43 | Gh3 | 2.73 | 0.236 | 0.710 |
| Example 78 | 3 | Rp16 | 2.3 | 0.640 | 0.330 | 32.5 | 0.53 | Gp8 | 2.3 | 0.210 | 0.710 |
| Example 79 | 3 | Rp17 | 2.3 | 0.640 | 0.330 | 33.6 | 0.53 | Gh10 | 2.3 | 0.210 | 0.710 |
| Example 80 | 3 | Rh12 | 2.3 | 0.640 | 0.330 | 33.7 | 0.46 | Gh10 | 2.3 | 0.210 | 0.710 |
| Example 81 | 3 | Rd7 | 2.3 | 0.640 | 0.330 | 33.5 | 0.40 | Gh10 | 2.3 | 0.210 | 0.710 |
| Comparative Example 1 | LED | Rpx | 2.9 | 0.640 | 0.359 | 21.5 | 1.25 | Gpx | 5.3 | 0.236 | 0.710 |
| Comparative Example 2 | 4 | Rp1 | 2.3 | 0.449 | 0.361 | 24.2 | 0.54 | Gp2 | 2.16 | 0.205 | 0.553 |

| | Green color filter | | Blue color filter | | | | | |
|---|---|---|---|---|---|---|---|---|
| | Y | $F_G \times C_G$ | | $F_B$ | x | y | Y | $F_B \times C_B$ | $\sigma_F$ |
| Example 61 | 46.3 | 0.94 | Bh1 | 2.44 | 0.152 | 0.060 | 10.3 | 0.54 | 0.02 |
| Example 62 | 58.3 | 0.76 | Bp1 | 2.47 | 0.150 | 0.060 | 9.4 | 0.83 | 0.06 |
| Example 63 | 58.3 | 0.76 | Bh1 | 2.44 | 0.152 | 0.060 | 10.3 | 0.54 | 0.06 |
| Example 64 | 58.3 | 0.76 | Bd1 | 2.46 | 0.152 | 0.060 | 11.3 | 0.58 | 0.05 |
| Example 65 | 58.3 | 0.76 | Bh2 | 2.44 | 0.152 | 0.060 | 9.7 | 0.60 | 0.05 |
| Example 66 | 51.5 | 1.18 | Bp3 | 2.3 | 0.150 | 0.060 | 9.0 | 0.83 | 0.00 |
| Example 67 | 51.5 | 1.18 | Bh3 | 2.3 | 0.152 | 0.060 | 11.3 | 0.58 | 0.00 |
| Example 68 | 51.8 | 1.18 | Bh3 | 2.3 | 0.152 | 0.060 | 11.3 | 0.58 | 0.00 |
| Example 69 | 51.8 | 1.18 | Bh3 | 2.3 | 0.152 | 0.060 | 11.3 | 0.58 | 0.00 |
| Example 70 | 55.0 | 0.89 | Bp2 | 2.8 | 0.148 | 0.060 | 6.8 | 0.93 | 0.19 |
| Example 71 | 52.3 | 1.01 | Bp1 | 2.7 | 0.149 | 0.060 | 8.1 | 0.91 | 0.16 |
| Example 72 | 44.7 | 0.72 | Bh1 | 2.6 | 0.151 | 0.060 | 8.9 | 0.59 | 0.08 |
| Example 73 | 43.4 | 1.01 | Bh1 | 2.6 | 0.151 | 0.060 | 8.9 | 0.59 | 0.05 |
| Example 74 | 55.0 | 0.89 | Bp1 | 2.7 | 0.149 | 0.060 | 8.1 | 0.91 | 0.08 |
| Example 75 | 55.0 | 0.89 | Bh1 | 2.6 | 0.151 | 0.060 | 8.9 | 0.59 | 0.18 |
| Example 76 | 55.0 | 0.89 | Bd1 | 2.6 | 0.151 | 0.060 | 9.9 | 0.62 | 0.10 |
| Example 77 | 55.0 | 0.89 | Bh2 | 2.49 | 0.151 | 0.060 | 8.4 | 0.61 | 0.10 |
| Example 78 | 40.4 | 0.86 | Bh4 | 2.3 | 0.150 | 0.060 | 8.5 | 0.73 | 0.00 |
| Example 79 | 40.8 | 0.83 | Bh4 | 2.3 | 0.150 | 0.060 | 8.5 | 0.73 | 0.00 |
| Example 80 | 40.8 | 0.83 | Bh5 | 2.3 | 0.150 | 0.060 | 8.5 | 0.47 | 0.00 |
| Example 81 | 40.8 | 0.83 | Bh5 | 2.3 | 0.150 | 0.060 | 8.5 | 0.47 | 0.00 |
| Comparative Example 1 | 26.2 | 2.02 | Bpx | 0.7 | 0.163 | 0.060 | 10.4 | 0.28 | 1.88 |
| Comparative Example 2 | 66.0 | 0.74 | Bp2 | 2.3 | 0.151 | 0.104 | 22.9 | 0.77 | 0.07 |

TABLE 25

| | Light-emitting device | | Red color filter | | | | | Green color filter | | |
|---|---|---|---|---|---|---|---|---|---|---|
| | | | $F_R$ | x | y | Y | $F_R \times C_R$ | | $F_G$ | x | y |
| Example 82 | 1 | Rp1 | 2.3 | 0.640 | 0.330 | 30.7 | 0.54 | Gh11 | 2.3 | 0.210 | 0.710 |
| Example 83 | 1 | Rp1 | 2.3 | 0.640 | 0.330 | 30.7 | 0.54 | Gh12 | 2.3 | 0.210 | 0.710 |
| Example 84 | 1 | Rp1 | 2.3 | 0.640 | 0.330 | 30.7 | 0.54 | Gd3 | 2.3 | 0.210 | 0.710 |
| Example 85 | 1 | Rh1 | 2.3 | 0.640 | 0.330 | 31.5 | 0.39 | Gh11 | 2.3 | 0.210 | 0.710 |
| Example 86 | 1 | Rh1 | 2.3 | 0.640 | 0.330 | 31.5 | 0.39 | Gh12 | 2.3 | 0.210 | 0.710 |
| Example 87 | 1 | Rh1 | 2.3 | 0.640 | 0.330 | 31.5 | 0.39 | Gd3 | 2.3 | 0.210 | 0.710 |
| Example 88 | 1 | Rh13 | 2.3 | 0.502 | 0.328 | 45.1 | 0.19 | Gh3 | 0.991 | 0.210 | 0.710 |
| Example 89 | 1 | Rh1 | 2.3 | 0.640 | 0.330 | 31.5 | 0.39 | Gh13 | 2.3 | 0.238 | 0.519 |
| Example 90 | 1 | Rh1 | 2.3 | 0.640 | 0.330 | 31.5 | 0.39 | Gh3 | 0.991 | 0.210 | 0.710 |

TABLE 25-continued

| | | | | | | | | | | |
|---|---|---|---|---|---|---|---|---|---|---|
| Comparative Example 3 | 1 | Rhx | 2.3 | 0.381 | 0.294 | 63.8 | 0.09 | Gh3 | 0.991 | 0.210 | 0.710 |
| Comparative Example 4 | 1 | Rh1 | 2.3 | 0.640 | 0.330 | 31.5 | 0.39 | Ghx | 2.3 | 0.264 | 0.318 |
| Comparative Example 5 | 1 | Rh13 | 2.3 | 0.502 | 0.328 | 45.1 | 0.19 | Gh3 | 0.991 | 0.210 | 0.710 |
| Comparative Example 6 | LED | Rp1 | 2.3 | 0.578 | 0.393 | 33.5 | 0.54 | Gp2 | 2.3 | 0.308 | 0.629 |

| | Green color filter | | | Blue color filter | | | | | |
|---|---|---|---|---|---|---|---|---|---|
| | Y | $F_G \times C_G$ | | $F_B$ | x | y | Y | $F_B \times C_B$ | $\sigma_F$ |
| Example 82 | 61.0 | 0.34 | Bp1 | 2.3 | 0.151 | 0.060 | 11.3 | 0.77 | 0.00 |
| Example 83 | 61.5 | 0.37 | Bp1 | 2.3 | 0.151 | 0.060 | 11.3 | 0.77 | 0.00 |
| Example 84 | 61.5 | 0.33 | Bp1 | 2.3 | 0.151 | 0.060 | 11.3 | 0.77 | 0.00 |
| Example 85 | 61.0 | 0.34 | Bh1 | 2.3 | 0.152 | 0.060 | 12.3 | 0.77 | 0.00 |
| Example 86 | 61.5 | 0.37 | Bh1 | 2.3 | 0.152 | 0.060 | 12.3 | 0.77 | 0.00 |
| Example 87 | 61.5 | 0.33 | Bh1 | 2.3 | 0.152 | 0.060 | 12.3 | 0.77 | 0.00 |
| Example 88 | 60.2 | 0.72 | Bp1 | 2.3 | 0.151 | 0.060 | 11.3 | 0.77 | 0.62 |
| Example 89 | 70.5 | 0.29 | Bp1 | 2.3 | 0.151 | 0.060 | 11.3 | 0.77 | 0.00 |
| Example 90 | 60.2 | 0.72 | Bp4 | 2.3 | 0.158 | 0.121 | 30.1 | 0.29 | 0.62 |
| Comparative Example 3 | 60.2 | 0.72 | Bp1 | 2.3 | 0.151 | 0.060 | 11.3 | 0.77 | 0.62 |
| Comparative Example 4 | 85.1 | 0.09 | Bp1 | 2.3 | 0.151 | 0.060 | 11.3 | 0.77 | 0.00 |
| Comparative Example 5 | 60.2 | 0.72 | Bhx | 2.3 | 0.206 | 0.178 | 55.9 | 0.09 | 0.62 |
| Comparative Example 6 | 53.3 | 1.03 | Bp2 | 2.3 | 0.149 | 0.056 | 7.9 | 0.77 | 0.00 |

TABLE 26

| | Chromaticity and lightness in white display | | | Color temperature | Color reproducibility | $T_{RL}/T_R$ | $T_{GL}/T_G$ | $T_{BL}/T_B$ |
|---|---|---|---|---|---|---|---|---|
| | Wx | Wy | WY | | | | | |
| Example 1 | 0.300 | 0.285 | 31.8 | 8112 | 100.0% | 0.99 | 1.00 | 0.92 |
| Example 2 | 0.298 | 0.293 | 33.3 | 8035 | 100.0% | 0.99 | 1.00 | 0.92 |
| Example 3 | 0.302 | 0.277 | 30.2 | 8208 | 100.0% | 0.99 | 1.00 | 0.92 |
| Example 4 | 0.302 | 0.274 | 29.8 | 8243 | 100.0% | 0.99 | 0.97 | 0.92 |
| Example 5 | 0.301 | 0.279 | 30.6 | 8183 | 100.0% | 0.99 | 1.00 | 0.92 |
| Example 6 | 0.299 | 0.288 | 32.3 | 8083 | 100.0% | 0.99 | 1.00 | 0.92 |
| Example 7 | 0.302 | 0.276 | 30.1 | 8221 | 100.0% | 0.99 | 0.94 | 0.92 |
| Example 8 | 0.302 | 0.277 | 30.3 | 8207 | 100.0% | 0.99 | 0.93 | 0.92 |
| Example 9 | 0.298 | 0.294 | 33.6 | 8023 | 100.0% | 0.99 | 0.98 | 0.92 |
| Example 10 | 0.298 | 0.295 | 33.8 | 8016 | 100.0% | 0.99 | 0.98 | 0.92 |
| Example 11 | 0.299 | 0.289 | 32.6 | 8068 | 100.0% | 0.99 | 0.99 | 0.92 |
| Example 12 | 0.299 | 0.290 | 32.8 | 8059 | 100.0% | 0.99 | 0.99 | 0.92 |
| Example 13 | 0.305 | 0.261 | 27.5 | 8452 | 100.0% | 0.99 | 0.96 | 0.92 |
| Example 14 | 0.302 | 0.274 | 29.8 | 8238 | 100.0% | 0.99 | 0.94 | 0.92 |
| Example 15 | 0.302 | 0.276 | 30.2 | 8208 | 100.0% | 0.99 | 0.91 | 0.92 |
| Example 16 | 0.302 | 0.278 | 30.5 | 8191 | 100.0% | 0.99 | 0.90 | 0.92 |
| Example 17 | 0.298 | 0.293 | 33.3 | 8069 | 100.0% | 0.99 | 1.00 | 0.92 |
| Example 18 | 0.286 | 0.277 | 33.4 | 9942 | 99.9% | 0.96 | 1.00 | 0.93 |
| Example 19 | 0.288 | 0.278 | 33.7 | 9614 | 99.9% | 0.98 | 1.00 | 0.93 |
| Example 20 | 0.289 | 0.278 | 33.7 | 9552 | 99.9% | 0.99 | 1.00 | 0.93 |
| Example 21 | 0.289 | 0.278 | 33.7 | 9551 | 99.9% | 0.99 | 1.00 | 0.93 |
| Example 22 | 0.291 | 0.278 | 34.0 | 9304 | 99.9% | 0.98 | 1.00 | 0.93 |
| Example 23 | 0.291 | 0.278 | 33.9 | 9352 | 99.9% | 0.98 | 1.00 | 0.93 |
| Example 24 | 0.287 | 0.278 | 33.6 | 9744 | 99.9% | 0.96 | 1.00 | 0.93 |
| Example 25 | 0.290 | 0.278 | 33.8 | 9438 | 99.9% | 0.97 | 1.00 | 0.93 |
| Example 26 | 0.291 | 0.278 | 33.9 | 9349 | 99.9% | 0.98 | 1.00 | 0.93 |
| Example 27 | 0.291 | 0.278 | 33.9 | 9354 | 99.9% | 0.98 | 1.00 | 0.93 |
| Example 28 | 0.288 | 0.268 | 32.4 | 10329 | 100.6% | 0.99 | 1.00 | 0.93 |
| Example 29 | 0.286 | 0.270 | 34.7 | 10429 | 99.7% | 0.99 | 0.94 | 0.96 |
| Example 30 | 0.286 | 0.271 | 34.8 | 10393 | 99.7% | 0.99 | 0.93 | 0.96 |

TABLE 27

| | Chromaticity and lightness in white display | | | Color temperature | Color reproducibility | $T_{RL}/T_R$ | $T_{GL}/T_G$ | $T_{BL}/T_B$ |
|---|---|---|---|---|---|---|---|---|
| | Wx | Wy | WY | | | | | |
| Example 31 | 0.291 | 0.280 | 34.4 | 9179 | 99.9% | 0.99 | 0.98 | 0.93 |
| Example 32 | 0.286 | 0.271 | 34.8 | 10393 | 99.7% | 0.99 | 0.98 | 0.96 |
| Example 33 | 0.292 | 0.275 | 33.4 | 9315 | 99.9% | 0.99 | 0.99 | 0.93 |
| Example 34 | 0.292 | 0.276 | 33.6 | 9288 | 99.9% | 0.99 | 0.99 | 0.93 |
| Example 35 | 0.291 | 0.238 | 28.6 | 13190 | 99.7% | 0.99 | 0.96 | 0.96 |
| Example 36 | 0.295 | 0.260 | 30.6 | 9842 | 99.9% | 0.99 | 0.94 | 0.93 |
| Example 37 | 0.291 | 0.280 | 34.4 | 9220 | 99.9% | 0.99 | 0.98 | 0.93 |
| Example 38 | 0.285 | 0.270 | 34.6 | 10505 | 99.7% | 0.99 | 0.98 | 0.96 |
| Example 39 | 0.284 | 0.270 | 34.5 | 10665 | 99.7% | 1.00 | 0.98 | 0.96 |
| Example 40 | 0.298 | 0.295 | 33.6 | 8001 | 100.0% | 1.00 | 0.98 | 0.92 |
| Example 41 | 0.284 | 0.270 | 34.5 | 10731 | 99.7% | 0.98 | 0.98 | 0.96 |
| Example 42 | 0.299 | 0.295 | 33.7 | 7958 | 100.0% | 0.98 | 0.98 | 0.92 |
| Example 43 | 0.286 | 0.279 | 33.7 | 9838 | 99.9% | 0.95 | 0.98 | 0.93 |
| Example 44 | 0.283 | 0.269 | 34.4 | 10818 | 99.7% | 0.97 | 0.98 | 0.96 |
| Example 45 | 0.284 | 0.270 | 34.5 | 10729 | 99.7% | 0.98 | 0.98 | 0.96 |
| Example 46 | 0.298 | 0.295 | 33.6 | 7995 | 100.0% | 0.98 | 0.98 | 0.92 |
| Example 47 | 0.283 | 0.259 | 33.1 | 11820 | 100.5% | 0.98 | 0.98 | 0.96 |
| Example 48 | 0.285 | 0.270 | 34.6 | 10555 | 99.7% | 0.99 | 0.98 | 0.96 |
| Example 49 | 0.288 | 0.253 | 31.2 | 11703 | 99.7% | 0.99 | 0.91 | 0.96 |
| Example 50 | 0.288 | 0.254 | 31.5 | 11589 | 99.7% | 0.99 | 0.90 | 0.96 |
| Example 51 | 0.284 | 0.270 | 34.5 | 10638 | 99.7% | 0.98 | 0.98 | 0.96 |
| Example 52 | 0.282 | 0.269 | 34.2 | 11025 | 99.7% | 0.99 | 0.98 | 0.96 |
| Example 53 | 0.281 | 0.269 | 34.1 | 11214 | 99.7% | 0.99 | 0.98 | 0.96 |
| Example 54 | 0.281 | 0.251 | 33.3 | 13242 | 99.7% | 0.99 | 1.00 | 1.00 |
| Example 55 | 0.279 | 0.260 | 35.0 | 12459 | 99.7% | 0.99 | 0.98 | 1.00 |
| Example 56 | 0.290 | 0.277 | 34.5 | 9443 | 99.7% | 0.99 | 0.98 | 0.98 |
| Example 57 | 0.322 | 0.311 | 32.2 | 6079 | 98.4% | 0.99 | 1.00 | 0.92 |
| Example 58 | 0.322 | 0.315 | 33.0 | 6068 | 98.1% | 0.99 | 0.98 | 0.92 |
| Example 59 | 0.314 | 0.296 | 33.1 | 6720 | 98.3% | 0.98 | 1.00 | 0.93 |
| Example 60 | 0.311 | 0.271 | 30.8 | 7465 | 98.2% | 0.99 | 0.94 | 0.96 |

TABLE 28

| | Chromaticity and lightness in white display | | | Color temperature | Color reproducibility | $T_{RL}/T_R$ | $T_{GL}/T_G$ | $T_{BL}/T_B$ |
|---|---|---|---|---|---|---|---|---|
| | Wx | Wy | WY | | | | | |
| Example 61 | 0.310 | 0.269 | 30.3 | 7617 | 98.9% | 0.99 | 0.93 | 0.96 |
| Example 62 | 0.315 | 0.300 | 34.0 | 6625 | 97.9% | 0.99 | 0.98 | 0.93 |
| Example 63 | 0.305 | 0.278 | 32.6 | 7852 | 98.6% | 0.98 | 0.98 | 0.96 |
| Example 64 | 0.300 | 0.279 | 34.4 | 8309 | 97.8% | 0.99 | 0.98 | 1.00 |
| Example 65 | 0.313 | 0.297 | 34.1 | 6773 | 97.7% | 0.99 | 0.98 | 0.98 |
| Example 66 | 0.312 | 0.290 | 30.8 | 6972 | 100.0% | 0.99 | 0.97 | 0.93 |
| Example 67 | 0.298 | 0.265 | 31.9 | 9163 | 99.8% | 0.98 | 0.97 | 0.97 |
| Example 68 | 0.298 | 0.266 | 32.0 | 9085 | 99.8% | 0.99 | 0.96 | 0.97 |
| Example 69 | 0.298 | 0.265 | 31.9 | 9196 | 99.8% | 0.98 | 0.96 | 0.97 |
| Example 70 | 0.340 | 0.330 | 31.8 | 5130 | 97.6% | 0.99 | 0.98 | 0.92 |
| Example 71 | 0.331 | 0.309 | 32.0 | 5561 | 97.7% | 0.98 | 1.00 | 0.93 |
| Example 72 | 0.326 | 0.283 | 29.8 | 5946 | 98.2% | 0.99 | 0.94 | 0.96 |
| Example 73 | 0.325 | 0.281 | 29.4 | 6022 | 98.8% | 0.99 | 0.93 | 0.96 |
| Example 74 | 0.332 | 0.314 | 33.0 | 5527 | 97.3% | 0.99 | 0.98 | 0.93 |
| Example 75 | 0.320 | 0.291 | 31.6 | 6318 | 98.2% | 0.98 | 0.98 | 0.96 |
| Example 76 | 0.315 | 0.290 | 33.4 | 6729 | 97.3% | 0.99 | 0.98 | 1.00 |
| Example 77 | 0.329 | 0.310 | 33.1 | 5663 | 97.1% | 0.99 | 0.98 | 0.98 |
| Example 78 | 0.324 | 0.274 | 27.1 | 6182 | 100.0% | 0.99 | 0.95 | 0.94 |
| Example 79 | 0.327 | 0.275 | 27.6 | 5915 | 100.0% | 0.98 | 0.92 | 0.94 |
| Example 80 | 0.327 | 0.275 | 27.7 | 5887 | 100.0% | 0.98 | 0.92 | 0.98 |
| Example 81 | 0.327 | 0.275 | 27.6 | 5938 | 100.0% | 0.98 | 0.92 | 0.98 |
| Comparative Example 1 | 0.279 | 0.215 | 19.4 | 32278 | 95.4% | — | — | — |
| Comparative Example 2 | 0.216 | 0.278 | 37.7 | 20791 | 39.8% | 0.98 | 0.92 | 0.98 |

TABLE 29

|  | Chromaticity and lightness in white display | | | Color temperature | Color reproducibility | $T_{RL}/T_R$ | $T_{GL}/T_G$ | $T_{BL}/T_B$ |
| --- | --- | --- | --- | --- | --- | --- | --- | --- |
|  | Wx | Wy | WY |  |  |  |  |  |
| Example 82 | 0.289 | 0.281 | 34.3 | 9424 | 99.9% | 0.99 | 0.99 | 0.93 |
| Example 83 | 0.289 | 0.281 | 34.5 | 9401 | 99.9% | 0.99 | 0.99 | 0.93 |
| Example 84 | 0.289 | 0.282 | 34.5 | 9398 | 99.9% | 0.99 | 0.98 | 0.93 |
| Example 85 | 0.286 | 0.271 | 35.0 | 10369 | 99.7% | 0.99 | 0.99 | 0.96 |
| Example 86 | 0.286 | 0.272 | 35.1 | 10332 | 99.7% | 0.99 | 0.99 | 0.96 |
| Example 87 | 0.286 | 0.272 | 35.1 | 10329 | 99.7% | 0.99 | 0.98 | 0.96 |
| Example 88 | 0.281 | 0.284 | 38.9 | 10098 | 70.3% | 0.99 | 0.98 | 0.96 |
| Example 89 | 0.291 | 0.270 | 37.8 | 9777 | 66.5% | 0.99 | 0.98 | 0.96 |
| Example 90 | 0.276 | 0.284 | 40.6 | 10704 | 90.3% | 0.99 | 0.98 | 0.96 |
| Comparative Example 3 | 0.263 | 0.276 | 45.1 | 13045 | 44.8% | 0.99 | 0.98 | 0.96 |
| Comparative Example 4 | 0.291 | 0.232 | 42.6 | 14800 | 31.7% | 0.99 | 0.98 | 0.96 |
| Comparative Example 5 | 0.282 | 0.301 | 53.8 | 9187 | 52.0% | 0.99 | 0.98 | 0.96 |
| Comparative Example 6 | 0.310 | 0.304 | 31.6 | 6917 | 63.6% | 0.99 | 0.98 | 0.96 |

INDUSTRIAL APPLICABILITY

According to the liquid crystal display device of the present invention, high color reproducibility and high luminance can be achieved and the yield in the production of the liquid crystal display device can be improved.

DESCRIPTION OF REFERENCE SIGNS 10a, 10b: liquid crystal display device
11: light source
12: color conversion layer
13a, 13b: polarizing plate
4a, 14b: substrate
15: color filter
15R: red color filter
15G: green color filter
15B: blue color filter
16: transparent electrode
17: liquid crystal layer
18: interlayer insulator
19: light guide
20: black matrix
21: thin film transistor
22: pixel electrode
23: spacer
24: color filter layer
25: light-emitting device
26: connection hole
27: reflection plate

The invention claimed is:

1. A color filter layer at least comprising a blue color filter, a green color filter and a red color filter;
wherein the red color filter is formed from a red-coloring composition comprising a coloring agent ($A_R$), a binder ($W_R$) and a solvent ($E_R$) and meets the requirement represented by formula (Q1): $0.1 \leq F_R \times C_R \leq 1.0$, wherein $F_R$ represents the thickness (μm) of the red color filter, and $C_R$ represents the ratio of the amount of the coloring agent ($A_R$) to the total amount of the coloring agent ($A_R$) and the binder ($W_R$) in the red-coloring composition; and the coloring agent ($A_R$) comprises a dye selected from the group consisting of an azo dye, an azo metal complex dye, a xanthene dye and a coumarin dye, and a pigment selected from the group consisting of a diketopyrrolopyrrole pigment, an azo pigment, an anthraquinone pigment, a quinophthalone pigment, an isoindoline pigment and an azomethine pigment;

the green color filter is formed from a green-coloring composition comprising a coloring agent ($A_G$), a binder ($W_G$) and a solvent ($E_G$) and meets the requirement represented by formula (Q2): $0.1 \leq F_G \times C_G \leq 1.2$, wherein $F_G$ represents the thickness (μm) of the green color filter, and $C_G$ represents the ratio of the amount of the coloring agent ($A_G$) to the total amount of the coloring agent ($A_G$) and the binder ($W_G$) in the green-coloring composition; and the coloring agent ($A_G$) comprises a dye selected from the group consisting of a phthalocyanine dye, a triarylmethane dye and a squarylium dye, and a phthalocyanine pigment;

the blue color filter is formed from a blue-coloring composition comprising a coloring agent ($A_B$), a binder ($W_B$) and a solvent ($E_B$) and meets the requirement represented by formula (Q3): $0.1 \leq F_B \times C_B \leq 1.0$, wherein $F_B$ represents the thickness (μm) of the blue color filter, and $C_B$ represents the ratio of the amount of the coloring agent ($A_B$) to the total amount of the coloring agent ($A_B$) and the binder ($W_B$) in the blue-coloring composition; and the coloring agent ($A_B$) comprises a dye selected from the group consisting of a phthalocyanine dye, a triarylmethane dye, an anthraquinone dye, a xanthene dye and a methine dye, and a pigment selected from the group consisting of a phthalocyanine pigment, an anthraquinone pigment and a dioxazine pigment; and the color filter layer being made to be used in a liquid crystal display device equipped with a light-emitting device which comprises a light source and a color conversion layer containing a quantum dot.

2. A method for producing a red color filter in a liquid crystal display device as defined in claim 1, which comprises a color filter layer and a light-emitting device which comprises a light source and a color conversion layer containing a quantum dot wherein the color filter layer at least comprises a blue color filter, a green color filter and a red color filter;

the red color filter is formed from a red-coloring composition comprising a coloring agent ($A_R$), a binder ($W_R$) and a solvent ($E_R$) and meets the requirement represented by formula (Q1): $0.1 \leq F_R \times C_R \leq 1.0$, wherein $F_R$ represents the thickness (μm) of the red color filter, and $C_R$ represents the ratio of the amount of the coloring agent ($A_R$) to the total amount of the coloring agent ($A_R$) and the binder ($W_R$) in the red-coloring composition;

the green color filter is formed from a green-coloring composition comprising a coloring agent ($A_G$), a binder ($W_G$) and a solvent ($E_G$) and meets the requirement represented by formula (Q2): $0.1 \leq F_G \times C_G \leq 1.2$, wherein $F_G$ represents the thickness (μm) of the green color filter, and $C_G$ represents the ratio of the amount of the coloring agent ($A_G$) to the total amount of the coloring agent ($A_G$) and the binder ($W_G$) in the green-coloring composition;

the blue color filter is formed from a blue-coloring composition comprising a coloring agent ($A_B$), a binder ($W_B$) and a solvent ($E_B$) and meets the requirement represented by formula (Q3): $0.1 \leq F_B \times C_B \leq 1.0$, wherein $F_B$ represents the thickness (μm) of the blue color filter, and $C_B$ represents the ratio of the amount of the coloring agent ($A_B$) to the total amount of the coloring agent ($A_B$) and the binder ($W_B$) in the blue-coloring composition;

an emission spectrum of light emitted from the light-emitting device has a first emission peak, a second emission peak and a third emission peak, the wavelength ($\lambda_1$) of the first emission peak ranges from 420 to 480 nm, the wavelength ($\lambda_2$) of the second emission peak ranges from 500 to 550 nm, and the wavelength ($\lambda_3$) of the third emission peak ranges from 580 to 650 nm;

the method comprising the step of applying the red-coloring composition comprising a coloring agent ($A_R$), a binder ($W_R$) and a solvent ($E_R$) onto a substrate;

wherein the red color filter meets the requirement represented by formula (Q1); and the coloring agent ($A_R$) comprises a dye selected from the group consisting of an azo dye, an azo metal complex dye, a xanthene dye and a coumarin dye, and a pigment selected from the group consisting of a diketopyrrolopyrrole pigment, an azo pigment, an anthraquinone pigment, a quinophthalone pigment, an isoindoline pigment and an azomethine pigment.

3. A method for producing a green color filter in a liquid crystal display device which comprise a color filter layer and a light-emitting device which comprises a light source and a color conversion layer containing a quantum dot;

wherein the color filter layer at least comprises a blue color filter, a green color filter and a red color filter;

the red color filter is formed from a red-coloring composition comprising a coloring agent ($A_R$), a binder ($W_R$) and a solvent ($E_R$) and meets the requirement represented by formula (Q1): $0.1 \leq F_R \times C_R \leq 1.0$, wherein $F_R$ represents the thickness (μm) of the red color filter, and $C_R$ represents the ratio of the amount of the coloring agent ($A_R$) to the total amount of the coloring agent ($A_R$) and the binder ($W_R$) in the red-coloring composition;

the green color filter is formed from a green-coloring composition comprising a coloring agent ($A_G$), a binder ($W_G$) and a solvent ($E_G$) and meets the requirement represented by formula (Q2): $0.1 \leq F_G \times C_G \leq 1.2$, wherein $F_G$ represents the thickness (μm) of the green color filter, and $C_G$ represents the ratio of the amount of the coloring agent ($A_G$) to the total amount of the coloring agent ($A_G$) and the binder ($W_G$) in the green-coloring composition;

the blue color filter is formed from a blue-coloring composition comprising a coloring agent ($A_B$), a binder ($W_B$) and a solvent ($E_B$) and meets the requirement represented by formula (Q3): $0.1 \leq F_B \times C_B \leq 1.0$, wherein $F_B$ represents the thickness (μm) of the blue color filter, and $C_B$ represents the ratio of the amount of the coloring agent ($A_B$) to the total amount of the coloring agent ($A_B$) and the binder ($W_B$) in the blue-coloring composition;

an emission spectrum of light emitted from the light-emitting device has a first emission peak, a second emission peak and a third emission peak, the wavelength ($\lambda_1$) of the first emission peak ranges from 420 to 480 nm, the wavelength ($\lambda_2$) of the second emission peak ranges from 500 to 550 nm, and the wavelength ($\lambda_3$) of the third emission peak ranges from 580 to 650 nm;

the method comprising the step of applying the green-coloring composition comprising a coloring agent ($A_G$), a binder ($W_G$) and a solvent ($E_G$) onto a substrate;

wherein the green color filter meets the requirement represented by formula (Q2); and the coloring agent ($A_G$) comprises a dye selected from the group consisting of a phthalocyanine dye, a triarylmethane dye and a squarylium dye, and a phthalocyanine pigment.

4. A method for producing a blue color filter in a liquid crystal display device which comprise a color filter layer and a light-emitting device which comprises a light source and a color conversion layer containing a quantum dot;

wherein the color filter layer at least comprises a blue color filter, a green color filter and a red color filter;

the red color filter is formed from a red-coloring composition comprising a coloring agent ($A_R$), a binder ($W_R$) and a solvent ($E_R$) and meets the requirement represented by formula (Q1): $0.1 \leq F_R \times C_R \leq 1.0$, wherein $F_R$ represents the thickness (μm) of the red color filter, and $C_R$ represents the ratio of the amount of the coloring agent ($A_R$) to the total amount of the coloring agent ($A_R$) and the binder ($W_R$) in the red-coloring composition;

the green color filter is formed from a green-coloring composition comprising a coloring agent ($A_G$), a binder ($W_G$) and a solvent ($E_G$) and meets the requirement represented by formula (Q2): $0.1 \leq F_G \times C_G \leq 1.2$, wherein $F_G$ represents the thickness (μm) of the green color filter, and $C_G$ represents the ratio of the amount of the coloring agent ($A_G$) to the total amount of the coloring agent ($A_G$) and the binder ($W_G$) in the green-coloring composition;

the blue color filter is formed from a blue-coloring composition comprising a coloring agent ($A_B$), a binder ($W_B$) and a solvent ($E_B$) and meets the requirement represented by formula (Q3): $0.1 \leq F_B \times C_B \leq 1.0$, wherein $F_B$ represents the thickness (μm) of the blue color filter, and $C_B$ represents the ratio of the amount of the coloring agent ($A_B$) to the total amount of the coloring agent ($A_B$) and the binder ($W_B$) in the blue-coloring composition;

an emission spectrum of light emitted from the light-emitting device has a first emission peak, a second emission peak and a third emission peak, the wavelength ($\lambda_1$) of the first emission peak ranges from 420 to 480 nm, the wavelength ($\lambda_2$) of the second emission peak ranges from 500 to 550 nm, and the wavelength ($\lambda_3$) of the third emission peak ranges from 580 to 650 nm;

the method comprising the step of applying the blue-coloring composition comprising a coloring agent ($A_B$), a binder ($W_B$) and a solvent ($E_B$) onto a substrate;

wherein the blue color filter meets the requirement represented by formula (Q3); and the coloring agent ($A_B$) comprises a dye selected from the group consisting of a phthalocyanine dye, a triarylmethane dye, an anthraquinone dye, a xanthene dye and a methine dye, and a pigment selected from the group consisting of a phthalocyanine pigment, an anthraquinone pigment and a dioxazine pigment.

* * * * *